US008761218B2

(12) United States Patent
Lin et al.

(10) Patent No.: US 8,761,218 B2
(45) Date of Patent: Jun. 24, 2014

(54) ALUMINUM GALLIUM NITRIDE BARRIERS AND SEPARATE CONFINEMENT HETEROSTRUCTURE (SCH) LAYERS FOR SEMIPOLAR PLANE III-NITRIDE SEMICONDUCTOR-BASED LIGHT EMITTING DIODES AND LASER DIODES

(75) Inventors: You-Da Lin, Goleta, CA (US); Hiroaki Ohta, Tokyo (JP); Shuji Nakamura, Santa Barbara, CA (US); Steven P. DenBaars, Goleta, CA (US); James S. Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 328 days.

(21) Appl. No.: 13/080,260

(22) Filed: Apr. 5, 2011

(65) Prior Publication Data
US 2011/0243172 A1  Oct. 6, 2011

Related U.S. Application Data

(60) Provisional application No. 61/320,954, filed on Apr. 5, 2010.

(51) Int. Cl.
 *H01S 5/34* (2006.01)
 *H01S 5/343* (2006.01)
(52) U.S. Cl.
 USPC .................................. 372/43.01; 372/45.01
(58) Field of Classification Search
 USPC ........................................ 372/43.01, 45.01
 See application file for complete search history.

(56) References Cited

U.S. PATENT DOCUMENTS

| | | | |
|---|---|---|---|
| 2003/0001153 A1* | 1/2003 | Iyechika et al. | 257/13 |
| 2003/0085409 A1* | 5/2003 | Shen et al. | 257/79 |
| 2007/0184637 A1* | 8/2007 | Haskell et al. | 438/481 |
| 2008/0179607 A1 | 7/2008 | DenBaars et al. | |
| 2009/0162962 A1 | 6/2009 | Suzuki et al. | |
| 2009/0194761 A1 | 8/2009 | Masui et al. | |
| 2009/0236694 A1 | 9/2009 | Mizuhara et al. | |
| 2009/0286063 A2 | 11/2009 | Dmitriev et al. | |
| 2010/0008393 A1 | 1/2010 | Enya et al. | |
| 2010/0074292 A1* | 3/2010 | Bour et al. | 372/45.011 |
| 2010/0309943 A1 | 12/2010 | Chakraborty et al. | |
| 2011/0064100 A1* | 3/2011 | Raring et al. | 372/44.011 |

FOREIGN PATENT DOCUMENTS

WO    2006/014472    2/2006

OTHER PUBLICATIONS

Lin, Y. et al., "Development of 516 nm green LDs for m-plane and semipolar GaN," Powerpoint slides, Solid State Lighting and Energy Center Annual Review, University of California, Santa Barbara, Nov. 5, 2010.

International Search Report mailed Jun. 20, 2011, International application No. PCT/US2011/031241, International filed Apr. 5, 2011.

(Continued)

*Primary Examiner* — Yuanda Zhang
*Assistant Examiner* — Michael Carter
(74) *Attorney, Agent, or Firm* — Gates & Cooper LLP

(57) ABSTRACT

A semipolar plane III-nitride semiconductor-based laser diode or light emitting diode, comprising a semipolar Indium containing multiple quantum wells for emitting light, having Aluminum containing quantum well barriers, wherein the Indium containing multiple quantum well and Aluminum containing barriers are grown in a semipolar orientation on a semipolar plane.

28 Claims, 24 Drawing Sheets

(56) References Cited

OTHER PUBLICATIONS

Kelchner, K. et al., "Nonpolar AlGaN-cladding-free blue laser diodes with InGaN waveguiding," Applied Physics Express 2 (2009) 071003.

Zhou, L. et al., "Structural characterization of non-polar (1 1 2 0) and semi-polar (1 1 2 6) GaN films grown on r-plane sapphire," Journal of Crystal Growth 310 (2008) 2981-2986.

Avramescu, A. et al., "True green laser diodes at 524 nm with 50 mW continuous wave output power on c-plane GaN," Applied Physics Express 3 (2010) 061003.

Enya, Y. et al., "531 nm green lasing of InGaN based laser diodes on semi-polar {2021} free-standing GaN substrates," Applied Physics Express 2 (2009) 082101.

Huang, C. et al., "Optical waveguide simulations for the optimization of InGaN-based green laser diodes," Journal of Applied Physics 107, 023101 (2010).

Kim, K. et al., "Study of nonpolar m-plane InGaN/GaN multiquantum well light emitting diodes grown by homoepitaxial metal-organic chemical vapor deposition," Applied Physics Letters 91, 181120 (2007).

Kubota, M. et al., "Continuous-wave operation of blue laser diodes based on nonpolar m-plane gallium nitride," Applied Physics Express 1 (2008) 011102.

Lin, Y. et al., "Blue-green InGaN/GaN laser diodes on miscut m-plane GaN substrate," Applied Physics Express 2 (2009) 082102.

Lin, Y. et al., "Characterization of blue-green m-plane InGaN light emitting diodes," Applied Physics Letters 94, 261108 (2009).

Lin, Y. et al., "Development of 516 nm green LDs for m-plane and semipolar GaN," Powerpoint slides, Sslec Annual Review, Santa Barbara, CA, Nov. 5, 2010.

Lin, Y. et al., "High quality InGaN/AlGaN multiple quantum wells for semipolar InGaN green laser diodes," Applied Physics Express 3 (2010) 082001.

Lin, Y. et al., "MOCVD growth and characterization of nonpolar and semipolar GaN-based green laser diodes," Thesis, Electrical and Computer Engineering Department, University of California, Santa Barbara, CA, 2010.

Nakamura, S. et al., "InGaN-based multi-quantum-well-structure laser diodes," Jpn. J. Appl. Phys., vol. 35 (1996) pp. L74-L76, part 2, No. 1B, Jan. 1996.

Ohta, H. et al., "Nonpolar/semipolar GaN technology for violet, blue, and green laser diodes," MRS Bulletin, vol. 34, May 2009, 324.

Okamoto, K. et al., "High-efficiency continuous-wave operation of blue-green laser diodes based on nonpolar m-plane gallium nitride," Applied Physics Express 1 (2008) 072201.

Okamoto, K. et al., "Nonpolar m-plane InGaN multiple quantum well laser diodes with a lasing wavelength of 499.8 nm," Applied Physics Letters 94, 071105 (2009).

Park, S. et al., "Depolarization effects in (1122)-oriented InGaN/GaN quantum well structures," Applied Physics Letters 90, 013505 (2007).

Park, S. et al., "Electronic and optical properties of a- and m-plane wurtzite InGaN-GaN quatum wells," IEEE Journal of Quantum Electronics, vol. 43, No. 12, Dec. 2007, 1175.

Raring, J. et al., "High-power high-efficiency continuous-wave InGaN laser diodes in the violet, blue, and green wavelength regimes," Proc. SPIE 7602 (2010) 760218.

Speck, J. et al., "Nonpolar and semipolar group III nitride-based materials," MRS Bulletin, vol. 34, May 2009, 304.

Tsuda, Y. et al., "Blue laser diodes fabricated on m-plane GaN substrates," Applied Physics Express 1 (2008) 011104.

Tyagi, A. et al., "AlGaN-cladding free green semipolar GaN based laser diode with a lasing wavelength of 506.4 nm," Applied Physics Express 3 (2010) 011002.

Tyagi, A. et al., "Partial strain relaxation via misfit dislocation generation at heterointerfaces in (Al,In)GaN epitaxial layers grown on semipolar (1122) GaN free standing substrates," Applied Physics Letters 95, 251905 (2009).

Wu, F. et al., "Stacking fault formation in the long wavelength InGaN/GaN multiple quantum wells grown on m-plan GaN," Applied Physics Letters 96, 231912 (2010).

Yoshizumi, Y. et al., "Continuous-wave operatin of 520 nm green InGaN-based laser diodes on semi-polar {2021} GaN substrates," Applied Physics Express 2 (2009) 092101.

\* cited by examiner

PREVIOUS TECHNOLOGY

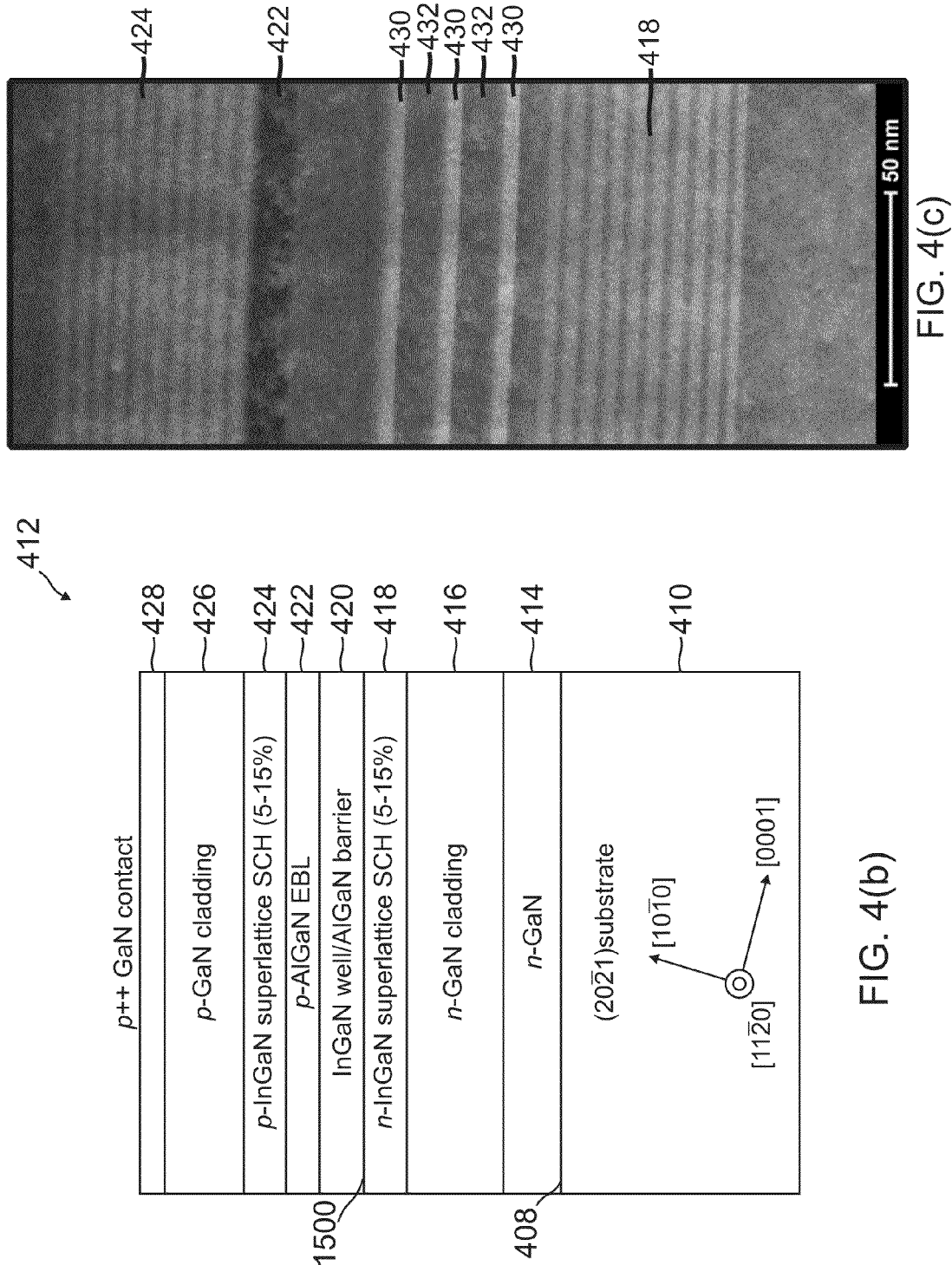

No misfit dislocation was observed

FIG. 7(b)  c-projection direction (a) GaN barrier in laser structure (b) InGaN barrier in laser structure (c) AlGaN barrier in laser structure

ALUMINUM GALLIUM NITRIDE BARRIERS AND SEPARATE CONFINEMENT HETEROSTRUCTURE (SCH) LAYERS FOR SEMIPOLAR PLANE III-NITRIDE SEMICONDUCTOR-BASED LIGHT EMITTING DIODES AND LASER DIODES

CROSS REFERENCE TO RELATED APPLICATIONS

This application claims the benefit under 35 U.S.C. Section 119(e) of co-pending and commonly assigned U.S. Provisional Patent Application Ser. No. 61/320,954, filed on Apr. 5, 2010, by You-Da Lin, Hiroaki Ohta, Shuji Nakamura, Steven P. DenBaars and James S. Speck, entitled "AlGaN BARRIERS AND SEPARATE CONFINEMENT HETEROSTRUCTURE (SCH) LAYERS FOR SEMIPOLAR PLANE III-NITRIDE SEMICONDUCTOR-BASED LIGHT EMITTING DIODES AND LASER DIODES";

which application is incorporated by reference herein.

This application is related to the following co-pending and commonly-assigned U.S. patent applications:

U.S. Utility patent application Ser. No. 12/030,117, filed on Feb. 12, 2008, now U.S. Pat. No. 8,211,723, issued on Jul. 3, 2012, by Daniel F. Feezell, Mathew C. Schmidt, Kwang Choong Kim, Robert M. Farrell, Daniel A. Cohen, James S. Speck, Steven P. DenBaars, and Shuji Nakamura, entitled "Al(x)Ga(1-x)N-CLADDING-FREE NONPOLAR GAN-BASED LASER DIODES AND LEDS," which application claims the benefit under 35 U.S.C. Section 119(e) of U.S. Provisional Patent Ser. No. 60/889,510, now abandoned, filed on Feb. 12, 2007, by Daniel F. Feezell, Mathew C. Schmidt, Kwang Choong Kim, Robert M. Farrell, Daniel A. Cohen, James S. Speck, Steven P. DenBaars, and Shuji Nakamura, entitled "Al(x)Ga(1-x)N-CLADDING-FREE NONPOLAR GAN-BASED LASER DIODES AND LEDS";

PCT international Patent Application Serial No. US2010/37629, filed on Jun. 7, 2010, by Arpan Chakraborty, You-Da Lin, Shuji Nakamura, and Steven P. DenBaars, entitled "ASYMMETRICALLY CLADDED LASER DIODE," which application claims the benefit under 35 U.S.C. Section 119(e) of U.S. Provisional Application Ser. No. 61/184,668, filed Jun. 5, 2009, by Arpan Chakraborty, You-Da Lin, Shuji Nakamura, and Steven P. DenBaars, entitled "ASYMMETRICALLY CLADDED LASER DIODE";

U.S. Utility application Ser. No. 12/795,390, filed on Jun. 7, 2010, by Arpan Chakraborty, You-Da Lin, Shuji Nakamura, and Steven P. DenBaars, entitled "LONG WAVELENGTH NONPOLAR AND SEMIPOLAR (Al, Ga, In)N BASED LASER DIODES," which application claims the benefit under 35 U.S.C. Section 119(e) of co-pending and commonly assigned U.S. Provisional Application Ser. No. 61/184,729, filed on Jun. 5, 2009, by Arpan Chakraborty, You-Da Lin, Shuji Nakamura, and Steven P. DenBaars, entitled "LONG WAVELENGTH m-PLANE (Al, Ga, In)N BASED LASER DIODES"; and U.S. Utility patent application Ser. No. 13/041,120, filed Mar. 4, 2011, by Po Shan Hsu, Kathryn M. Kelchner, Robert M. Farrell, Daniel Haeger, Hiroaki Ohta, Anurag Tyagi, Shuji Nakamura, Steven P. DenBaars, and James S. Speck, entitled "SEMI-POLAR III-NITRIDE OPTOELECTRONIC DEVICES ON M-PLANE SUBSTRATES WITH MISCUTS LESS THAN +/−15 DEGREES IN THE C-DIRECTION," which application claims the benefit under 35 U.S.C. Section 119(e) of co-pending and commonly assigned U.S. Provisional Patent Application Ser. No. 61/310,638 filed on Mar. 4, 2010 by Po Shan Hsu, Kathryn M. Kelchner, Robert M. Farrell, Daniel Haeger, Hiroaki Ohta, Anurag Tyagi, Shuji Nakamura, Steven P. DenBaars, and James S. Speck, entitled "SEMI-POLAR III-NITRIDE OPTOELECTRONIC DEVICES ON M-PLANE SUBSTRATES WITH MISCUTS LESS THAN +/−15 DEGREES IN THE C-DIRECTION";

which applications are incorporated by reference herein.

BACKGROUND OF THE INVENTION

1. Field of the Invention

This invention relates to semipolar plane III-nitride semiconductor-based laser diodes (LDs) with AlGaN barriers and a superlattice separate confinement heterostructure (SCH), and methods of fabrication thereof.

2. Description of the Related Art (Note: This application references a number of different publications as indicated throughout the specification by one or more reference numbers within brackets, e.g., Ref. [x]. A list of these different publications ordered according to these reference numbers can be found below in the section entitled "References." Each of these publications is incorporated by reference herein.)

Wurtzite (Al, Ga, In)N laser diodes (LDs) are one of the promising candidates for green laser applications. Since the first c-plane GaN-based Laser Diode (LD) was demonstrated by Nakamura et al. [1], there have been significant developments towards long wavelength LDs. Recently, the longest lasing wavelength of c-plane LDs reached 532 nm under pulsed operation [2]. Despite successful demonstration of the green LDs, the devices grown on the c-plane suffer from the Quantum Confined Stark Effect (QCSE) due to the large polarization-related electric fields, which cause lower internal quantum efficiencies due to the spatial separation of the electron and hole wave functions in the quantum wells [3]. This may also cause higher operation voltage, which results in the small wall plug efficiency [2]. Nonpolar and semipolar GaN-based devices are also promising for longer wavelength LDs because they exhibit no or very little QCSE [4-7]. Higher gain for LDs grown on nonpolar and semipolar orientations due to anisotropic band structures has been theoretically predicted and experimentally demonstrated [8-9]. Also, nonpolar m-plane LDs have a higher slope efficiency than c-plane LDs under actual LD operation [10-12]. However, the longest lasing wavelengths for m-plane LDs obtained by the present invention's research group is 492 nm [13], by using miscut m-plane GaN substrates [14], and the longest published lasing wavelength on a nominally on-axis m-plane was 499.8 nm [15]. The difficulty of achieving indium incorporation in the multiple quantum wells (MQWs), and the possibility of basal plane stacking fault (BPSF) formation in the wells [16], have so far limited the lasing wavelength to less than 500 nm for m-plane LDs.

Semipolar planes of GaN offer an approach that reduces polarization-related electric fields and possibly increases gain in comparison to c-plane GaN. The semipolar plane (20-21) has demonstrated lasing wavelengths of 531 nm under pulsed operation [17], and lasing wavelengths of 523 nm under CW operation [18]. To achieve high internal quantum efficiency from the high In content quantum well (QW) emitting green light, indium segregation and defects generated due to large strains must be eliminated in the high indium content QW. Enya et al. utilized lattice-matched quaternary AlInGaN cladding to reduce strain in the epitaxial structure and realize sufficient optical confinement [17]. Tyagi et al. reported high indium content InGaN guiding layers with GaN cladding layers as another method to avoid the difficulty of quaternary AlInGaN growth [19]. Although long wavelength LDs grown on (20-21) bulk GaN substrates have been demonstrated, a detailed growth study for high quality active region growths has not been reported.

In addition, conventional (20-21)-plane LD structures include the following characteristics:

1. Conventional state-of-the-art (20-21)-plane LDs are grown with InGaN or GaN barriers in the active region, as shown in FIG. 1. FIG. 1 illustrates a LD device 100 structure comprising a (20-21) GaN substrate 102, n-type GaN (n-GaN) layer 104 on or above the GaN substrate 102, n-GaN cladding layer 106 on or above the n-GaN layer 104, n-InGaN bulk Separate Confinement Heterostructure (SCH) layer 108 (with 5-10% In composition, e.g., 6%) on or above the n-GaN cladding layer 106, a light emitting active layer 110, comprising one or more InGaN quantum wells with GaN or InGaN barriers, on or above the n-InGaN bulk SCH 108, a p-type AlGaN (p-AlGaN) electron blocking layer (EBL) 112 on or above the active layer 110, a p-InGaN bulk SCH layer 114 (with 5-10% In composition, e.g., 6%) on or above the p-AlGaN EBL 112, a p-type GaN (p-GaN) cladding layer 116 on or above the p-InGaN bulk SCH layer 114, and a p$^{++}$-type GaN contact layer 118 on or above the p-GaN cladding layer 116.

2. Conventional state-of-the-art (20-21)-plane LDs do not use high In content InGaN superlattice SCH layers.

3. Conventional state-of-the-art (20-21)-plane LDs do not use asymmetric InGaN/GaN short period superlattice (SPSLS) for the InGaN SCH layers.

Consequently, there is a need in the art for improved LD structures. The present invention satisfies that need. The present invention discloses a high quality active region growth with AlGaN barrier (e.g., AlGaN/InGaN MQWs) and demonstrates 516 nm lasing emission under room temperature for semipolar (20-21) nitride.

SUMMARY OF THE INVENTION

To overcome the limitations in the prior art described above, and to overcome other limitations that will become apparent upon reading and understanding the present specification, the present invention discloses semipolar plane III-nitride semiconductor-based LDs with AlGaN barriers and a superlattice SCH, and methods of fabrication thereof.

Specifically, the present invention describes techniques to fabricate long wavelength LDs employing a semipolar (20-21)-plane InGaN/GaN based active region. The invention features novel structure and epitaxial growth techniques to improve structural, electrical, and optical properties of long wavelength LDs, especially in the green spectral range.

In this spectral range, large scale triangular nonradiative defects have been observed from (20-21)-plane InGaN quantum wells. Surface undulations have been shown in the laser structure with a high Indium (In) composition guiding layer, which are related to misfit dislocation generation.

Using AlGaN barriers as a strain compensation layer can maintain smooth surface morphology, reduce the number of triangular nonradiative defects, and enable the present invention to increase In composition in the SCH. Using InGaN superlattice SCH layers provides higher average In composition in the SCH, so that higher index difference and higher confinement factor, than InGaN bulk guiding layers, can be achieved.

For example, the present invention discloses a semipolar plane III-nitride semiconductor-based optoelectronic device structure, comprising one or more III-Nitride device layers including an active layer, wherein the active layer includes Aluminum (Al) containing quantum well barrier layers; and a semipolar Indium (In) containing quantum well layer positioned between the Al containing quantum well barrier layers, wherein the semipolar In containing quantum well layer and the Al containing quantum well barrier layers are grown in a semipolar orientation on a semipolar plane.

An Al percentage composition x in the AlGaN quantum well barriers may be 0<x<5%. The In containing quantum well layer may have a higher composition of In as compared to a device without AlGaN quantum well barrier layers. The In containing quantum well layer and the Al containing barrier layers may be such that the device emits or absorbs light having a peak intensity in a green, yellow, or red spectral range, for example, such that the device emits or absorbs light having a peak wavelength greater than 515 nm. The In containing quantum well layer may have an Indium composition of at least 16% and a thickness greater than 4 nanometers, for example.

The semipolar plane may be a 20-21, 11-22, 30-31, 30-3-1, 10-1-1, (n 0-n 1), (n 0-n−1) plane, and n is an integer, such that planar step growth is achieved, and the III-Nitride device layers and the quantum well structure have smooth planar surfaces and interfaces.

The III-Nitride device layers may be coherently grown without stacking faults or misfit dislocations. The III-Nitride device layers may have a root mean square surface roughness of less than 0.07 nm.

The III-Nitride device layers may form a light emitting device, wherein the active layer emits light, and the device emits the light uniformly across one or more of an entirety of a top surface, an entirety of a bottom surface, or an entirety of a sidewall of the active layer.

The III-Nitride device layers may further comprise an upper In containing separate confinement heterostructure (SCH) or waveguiding layer and a lower In containing SCH or waveguiding layer positioned on either side of the active layer, wherein In composition of the upper and lower In containing waveguiding or SCH layers is higher than the In composition in SCH or waveguiding layers of a similar device without Al containing quantum well barriers.

The III-Nitride device layers may further comprise an upper In containing SCH or waveguiding layer and a lower In containing SCH or waveguiding layer positioned on either side of the active layer, wherein the upper and lower In containing waveguiding or SCH layers have an In composition greater than 10%.

The Al containing layers may be AlGaN and In containing layers may be InGaN, for example.

At least one of the upper In containing SCH and lower SCH may be an InGaN/GaN or InGaN/AlGaN super-lattice (SL) structure comprising varying In composition.

An Al composition of the Al containing quantum well barriers may reduce or prevent misfit dislocations in the III-Nitride device layers caused by the In composition of the lower and upper In containing SCH, by compensating strain in the device structure caused by the lower and upper In containing SCH, as compared to quantum well barriers having a lower Al composition. An Al composition of the Al containing quantum well barriers may reduce or prevent triangular dark defects in the device structure caused by an In composition in the quantum wells, by compensating strain due to the In composition in the quantum wells, as compared to quantum well barriers having a lower Al composition. Dark defects in the device structure may have a surface area less than 100 micrometers by 100 micrometers.

The device structure may be a laser diode structure having an optical confinement factor of at least 3 and an output power of at least for a drive current of 20 mA. The device may further comprise a laser cavity bounded by two mirrors, wherein the mirrors are etched by dry etching or cleaved.

The device may be a (20-21) plane laser diode emitting green light. For example, the laser diode may comprise an AlGaN-cladding-free laser diode (or laser diode without cladding layers containing Al), wherein the III-Nitride device layers further comprise a first GaN cladding layer deposited on or above the semipolar plane of a GaN substrate; a first InGaN guiding layer deposited on or above the first GaN cladding layer; the active layer deposited on or above the first InGaN guiding layer; a second InGaN guiding layer deposited on or above the active layer; and a second GaN cladding layer deposited on or above the second InGaN guiding layer.

The present invention further discloses a method for fabricating a semipolar plane III-nitride semiconductor-based optoelectronic device, comprising forming one or more III-Nitride device layers including an active layer, wherein the active layer is formed by depositing Al containing quantum well barrier layers; and positioning a semipolar In containing quantum well layer such that the semipolar In containing quantum well is positioned between the Al containing quantum well barrier layers, wherein the semipolar In containing quantum well layer and the Al containing quantum well barrier layers are grown in a semipolar orientation on a semipolar plane.

The present invention further discloses a method of using an Al containing barrier layer in a quantum well structure of a device, comprising using the Al containing barrier layer to reduce prevent one or more of misfit dislocations, stacking faults, or dark, non luminescent defects in the device.

BRIEF DESCRIPTION OF THE DRAWINGS

Referring now to the drawings in which like reference numbers represent corresponding parts throughout:

FIG. 4(b) is a schematic cross-section of a device structure according to another embodiment of the present invention, wherein the arrows indicate the 10-10 and 0001 directions of GaN, and the circle indicates the 11-20 direction of GaN (out of the plane of the paper).

FIG. 4(c) is a transmission electron microscope (TEM) image through device layers of the structure of FIG. 4(b).

FIG. 4(e) and FIG. 4(f) show TEM images of an AlGaN-cladding free laser structure with AlGaN barrier and 7% InGaN SCH, wherein FIG. 4(e) is for g=0002 (indicated by the arrow) and FIG. 4(f) is for g=11-20 (indicated by the arrow), and the scale is 50 nm in both Figures.

FIG. 7(a) and FIG. 7(b) show fluorescence microscope images of the AlGaN-cladding-free LD structure of FIG. 1 grown on a (20$\bar{2}$1) plane, the LD active region comprising a 3 period MQW including 3 InGaN quantum wells having a 4.5 nm thickness and 10 nm thick InGaN barriers, showing large black triangle regions (having reduced light output) and dark line defects, wherein the c-projection direction and a-direction of the III-Nitride in the laser structure are indicated by arrows, and the scale is 100 micrometers in FIG. 7(a) and 20 micrometers in FIG. 7(b).

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

A purpose of the present invention was to develop high-efficiency semipolar (20$\bar{2}$1)-plane LDs in the green spectral range. A goal was to achieve smooth interfaces and smooth surface morphology and reduce nonradiative defects while using high In content InGaN wells, together with a highly efficient active region, and uniform and smooth high In content InGaN superlattice SCH layers.

Figure 13:
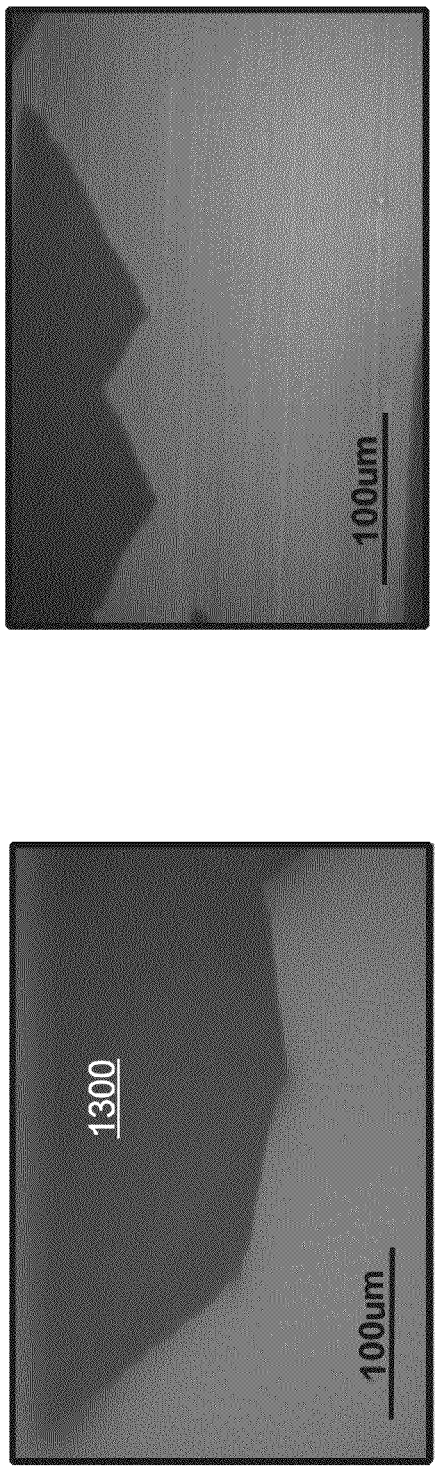
FIG. 13 shows fluorescence microscope images of laser structures with (a) GaN barrier, (b) InGaN barrier, and (c) AlGaN barrier, wherein the scale is 100 μm in (a), (b) and (c).
Figure 13:
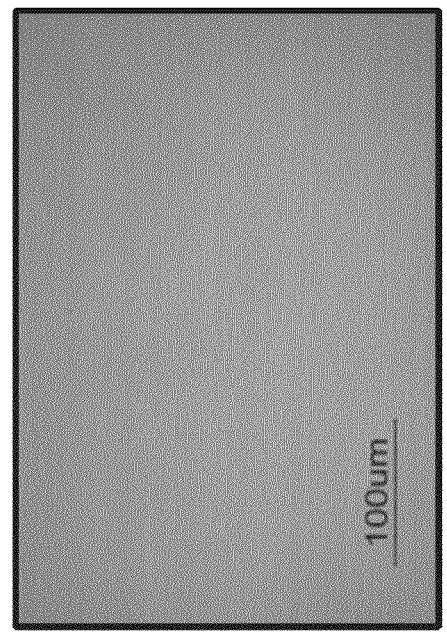

The use of AlGaN barriers before and between quantum wells resulted in smooth morphology (as illustrated in the fluorescence microscope images), and smooth interfaces in the laser structure with InGaN SCH layers (having In %>5%). In the AlGaN-cladding free LD (InGaN guiding/GaN cladding), the present invention confirmed AlGaN-barriers were effective at preventing triangular nonradiative defects, as shown in FIG. 13, for example.

By using AlGaN barriers, the present invention may increase In composition in guiding layers that can enhance optical confinement. The use of InGaN superlattice SCH layers resulted in higher average In content (~10% In) than in InGaN bulk SCH layers (~6% In) under the same growth conditions.

Based on this technology, the present invention confirmed lasing at 513 nm and 516 nm.

Nomenclature

GaN and its ternary and quaternary compounds incorporating aluminum and indium (AlGaN, InGaN, AlInGaN) are commonly referred to using the terms (Al, Ga, In)N, III-nitride, Group III-nitride, nitride, $Al_{(1-x-y)}In_yGa_xN$ where 0<x<1 and 0<y<1, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al, Ga, In)N materials within the scope of the invention may further include minor quantities of dopants and/or other impurity or inclusional materials. Boron (B) may also be included.

The term "$Al_xGa_{1-x}$N-cladding-free" refers to the absence of waveguide cladding layers containing any mole fraction of Al, such as $Al_xGa_{1-x}$N/GaN superlattices, bulk $Al_xGa_{1-x}$N, or AlN. Other layers not used for optical guiding may contain some quantity of Al (e.g., less than 10% Al content). For example, an $Al_xGa_{1-x}$N electron blocking layer may be present.

One approach to eliminating the spontaneous and piezoelectric polarization effects in GaN or III-nitride based optoelectronic devices is to grow the III-nitride devices on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al, In, B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Technical Description

The present invention discloses a LD comprising semipolar GaN, GaN cladding, InGaN guiding layers, and AlGaN barriers. AlGaN-cladding free devices are suitable for mass-production because AlGaN growth causes various difficulties, and InGaN guiding is essential to confine the LD's optical mode. Higher In composition is preferable, but high In causes misfit dislocations (see Ref [1]). AlGaN barriers can prevent misfit dislocation by compensating strain, which enables the present invention to increase In composition in the guiding layer.

Process Steps

Figure 2:
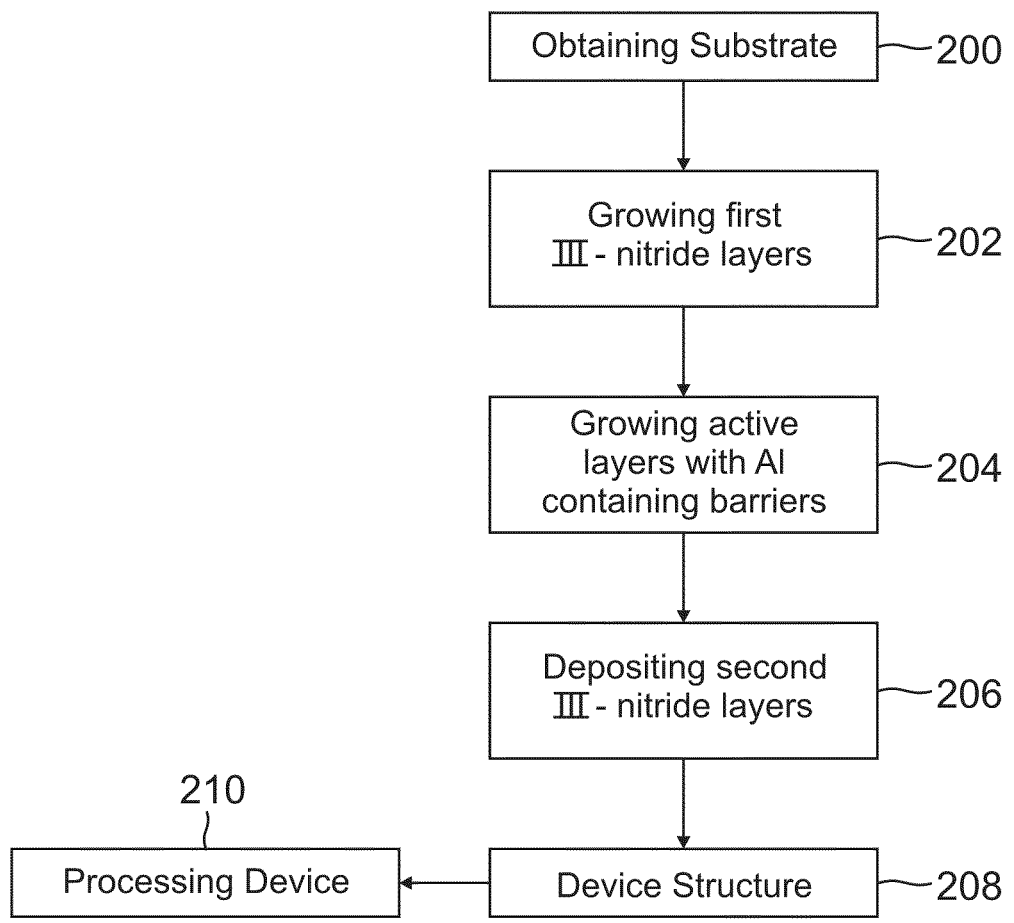
FIG. 2 is a flowchart illustrating a method of the present invention.

FIG. 2 is a flowchart illustrating a method of fabricating a semipolar plane III-nitride semiconductor-based optoelectronic device. The method comprises the following steps.

Block 200 represents obtaining a substrate suitable for semipolar growth, for example, a free standing (20-21) GaN substrate provided by Mitsubishi Chemical Corporation.

Block 202 represents depositing (e.g., growing) one or more first III-Nitride device layers on the substrate. The first III-Nitride layers may comprise one or more first polarity or first doped (e.g., n-type or p-type) III-Nitride layers on the substrate.

Figure 3:
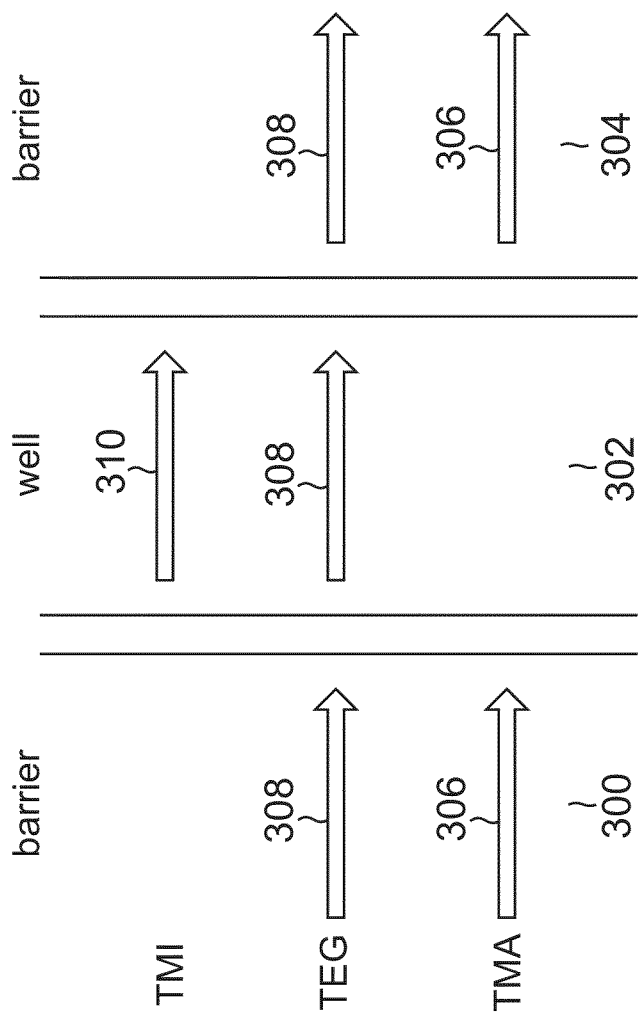
FIG. 3 illustrates a method of fabricating quantum wells according to the present invention.

Block 204 represents depositing one or more III-Nitride active layers on the III-Nitride layers of Block 202. FIG. 3 illustrates that the step may comprise depositing a first Aluminum (Al) containing (e.g., $Al_xGa_{1-x}$N where 0<x<1) quantum well barrier layer 300 (e.g., on the n-type or p-type III-Nitride layers of Block 202), followed by an Indium (In) containing quantum well layer 302 deposited on the first Al containing quantum well barrier layer 300, followed by a second Al containing (e.g., $Al_xGa_{1-x}N$ where 0<x<1) quantum well barrier layer 304 deposited on the In containing quantum well layer 302. Layers may be deposited such that there are multiple quantum wells (MQWs). FIG. 3 illustrates the barrier layers 300, 304 grown using Triethlyaluminum (TMA) flows 306 and Triethlylgallium (TEG) flows 308, and the quantum well layer 302 grown using trimethylindium (TMI) flow 310 and TEG flow 308, for example. In the case of MQWs, at least one AlGaN barrier may be positioned between each QW in the MQW.

The Al percentage composition x in the Al containing (e.g., $Al_xGa_{1-x}N$) quantum well barriers 300, 304 may be 0<x<5%, for example. An Al composition of the AlGaN quantum well barriers may reduce or prevent triangular dark defects in the LED caused by high In composition in the quantum wells of the multi quantum well, by compensating strain in the high In composition in the quantum wells, as compared to quantum well barrier(s) having a lower Al composition.

The In containing (e.g., InGaN) quantum well layer 302 may have a higher composition of Indium (In) as compared to a device without the first and second Al containing (e.g., AlGaN) quantum well barrier layers 300, 304. The In containing (e.g., InGaN) quantum well layer 302 and the first and second Al containing (e.g., AlGaN) barrier layers 300, 304 may be such that the device emits or absorbs light having a peak intensity in a green, yellow, or red spectral range, e.g., a peak wavelength greater than 515 nm or 528 nm. The In containing (e.g., InGaN) quantum well layer 302 may have an Indium composition of at least 16% and a thickness greater than 4 nanometers, for example. Typically, as In incorporation in the QW increases, emission wavelength from the QW is increased towards longer wavelengths.

Block 206 represents depositing one or more second III-Nitride layers on the active layer of Block 204. The second III-Nitride layers may comprise one or more second polarity or second doped (n-type or p-type) III-Nitride layers. The second polarity or second doped III-Nitride layers may have an opposite polarity to the layers in Block 202, for example. For example, if n-type III-Nitride layers are deposited in Block 202, then p-type III-Nitride layers may be deposited in Block 206. Or, if p-type III-Nitride layers are deposited in Block 202, then p-type III-Nitride layers may be deposited in Block 206, for example.

The III-Nitride layers of Blocks 202 and 206 may include waveguiding layers and cladding layers (e.g., GaN or AlGaN cladding layers), for example.

Throughout this disclosure, the term "on" (as used to describe a first layer "on" a second layer) is defined to include the first layer on or above, overlying, or coupled to, the second layer.

Block 208 represents the resulting device structure.

Figure 4A:
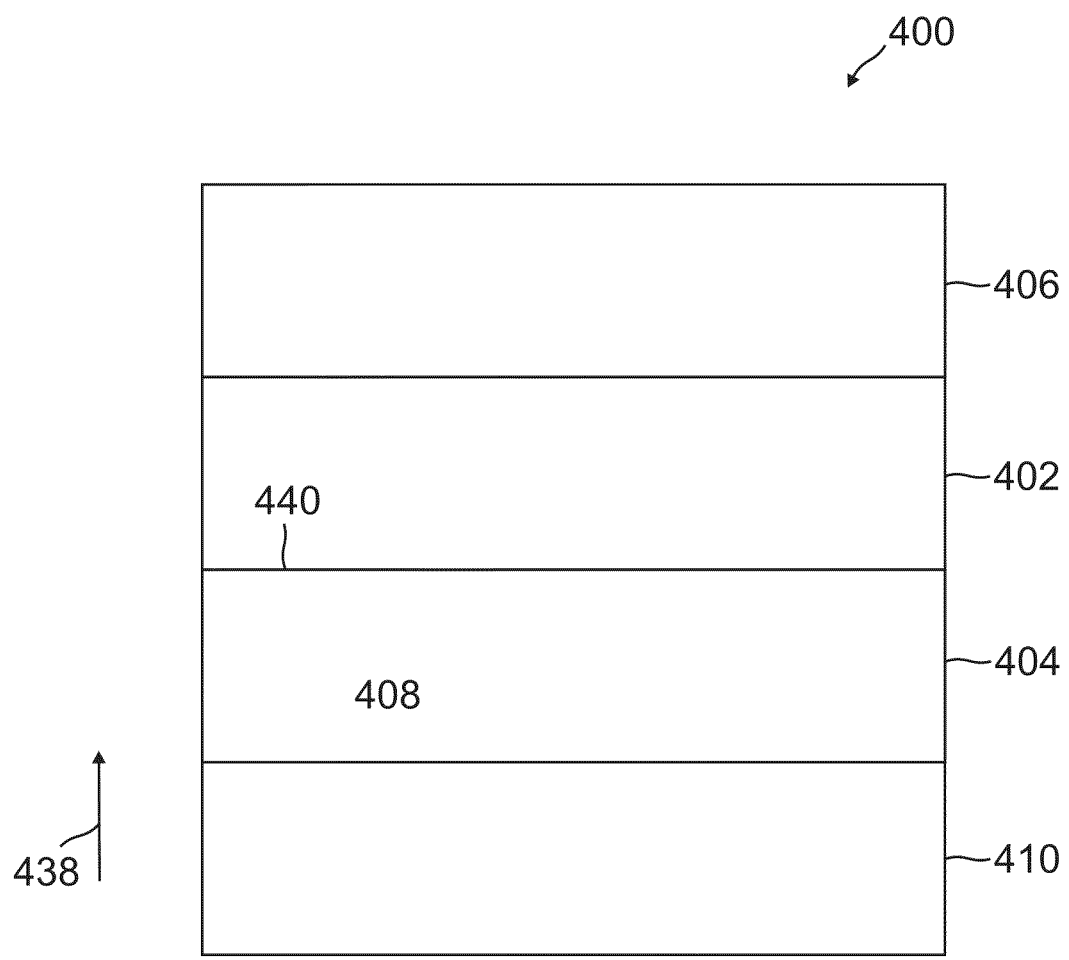
FIG. 4(a) is a schematic cross-section of a device structure according to an embodiment of the present invention.

In one embodiment, as illustrated in FIG. 4(a), the resulting device structure 400 comprises III-Nitride device layers including one or more III-Nitride active layers 402 positioned between a first doped (e.g., n-type) III-Nitride device layer 404 and a second doped III-Nitride device layer 406 (e.g., p-type). Alternatively, layer 404 may be p-type and layer 406 may be n-type. The III-Nitride layers are deposited on a top surface 408 of a substrate 410 (e.g., GaN). The top surface of the GaN substrate may be a semipolar plane (e.g., a 20-21, 11-22, 30-31, 30-3-1, 10-1-1, (n 0-n 1), (n 0-n–1) plane), where n is an integer, such that planar step growth is achieved, and the device's layers and the quantum well structure have smooth planar surfaces.

The III-Nitride layers are not limited to a particular type of device layer. For example, the III-Nitride layers of the optoelectronic device may be device layers for a LD, AlGaN cladding free LD, light emitting diode (LED), solar cell, photodetector, photonic crystal laser, Vertical Cavity Surface Emitting Laser, superluminescent diode, semiconductor amplifier, transistor (e.g., High Electron Mobility Transistor (HEMT)), etc.

In another embodiment, FIG. 4(b) shows the resulting device structure comprises an LD structure 412 grown homoepitaxially on a free standing (20-21) GaN substrate 410, on a top surface 408 of the substrate 410 that is a (20-21) semipolar plane.

The structure of FIG. 4(b) is AlGaN-cladding-free and further comprises an n-type GaN (n-GaN) layer 414 on the GaN substrate 410, an n-GaN cladding layer 416 (1 μm thick Si-doped n-GaN) on the n-GaN layer 414; an n-type InGaN (n-InGaN) superlattice (SL) SCH or waveguide layer 418 with 5-15% In composition (50-nm-thick Si-doped $In_xGa_{1-x}N$ (x=7~10%)), on the n-GaN cladding layer 416, an active region 420 comprising a quantum well structure including the semipolar InGaN quantum wells, and the AlGaN quantum well barriers between the semipolar InGaN quantum wells (3-period-MQW with 4.5 nm thick InGaN well and 10 nm thick AlGaN barrier), wherein the quantum well structure is on the n-type InGaN SL SCH 418; a p-type AlGaN electron blocking layer (EBL) (10 nm thick $Al_{0.20}Ga_{0.80}N$) 422 on the active layer 420; a p-type InGaN (p-InGaN) SL SCH or waveguide layer with 5-15% In composition (50-nm-thick Mg-doped $In_xGa_{1-x}N$ (x=7~10%)) 424 on the AlGaN EBL 422; a p-type GaN (p-GaN) cladding layer 426 (500 nm thick Mg-doped p-GaN) on the p-type InGaN SCH or waveguide layer 424, and a $p^{++}$ type GaN contact layer (100-nm-thick Mg-doped $p^{++}$ GaN contact layer) 428 on the p-type GaN cladding layer 426.

However, in another embodiment the device may have cladding layers 416, 426 of a material different from GaN, for example, AlGaN cladding layers may be used.

The device structure may be grown by atmospheric pressure metal organic chemical vapor deposition (MOCVD). Growth conditions are as described in [27] (U.S. Utility application Ser. No. 12/795,390, filed on Jun. 7, 2010, by Arpan Chakraborty, You-Da Lin, Shuji Nakamura, and Steven P. DenBaars, entitled "LONG WAVELENGTH NONPOLAR AND SEMIPOLAR (Al, Ga, In)N BASED LASER DIODES," which application is incorporated by reference herein)

The n-type and p-type III-Nitride layers of Blocks 202 and 206 may comprise lower and upper Indium (In) containing (e.g., InGaN) waveguiding layers, or SCH layers, that are a bulk structure or InGaN/GaN (or InGaN/AlGaN) super-lattice (SL) structures 418, 424 comprising varying In composition. The lower and upper In containing (e.g., InGaN) guiding layers or SCH 418, 424 may be positioned (e.g., on either side of the active layer 420, so that the active layer is on the lower guiding layer and underneath the upper guiding layer) and have a composition such as to confine an optical mode of the laser diode between the lower and upper In containing guiding layers or SCH 418, 424. The In composition of the lower and upper In containing waveguiding layers or SCH can be higher than an In composition in upper and lower waveguiding layers of a laser diode or similar device without Al containing (e.g., AlGaN) quantum well barriers. The In composition of the lower and upper In containing (e.g., InGaN) waveguiding or SCH layers 418, 424 may be greater than 5%, or greater than 10%, for example. Waveguiding layers may also be referred to as guiding layers.

FIG. 4(c) is a TEM image of a LD fabricated with the structure of FIG. 4(b), showing the SCH layers 418, 424 are SL structures. FIG. 4(c) also shows a quantum well structure of the active layer 420 includes the semipolar InGaN quantum wells 430, and the AlGaN quantum well barriers 432 between the semipolar InGaN quantum wells 430, and the AlGaN EBL 422.

Thus, block 204, FIG. 4(a), and FIG. 4(b) illustrate one or more III-Nitride device layers including an active layer 402, wherein the active layer includes at least first and second AlGaN quantum well barrier layers 432; and a semipolar InGaN quantum well layer 430 positioned between the first and second AlGaN quantum well barrier layers 432, wherein the semipolar InGaN quantum well layer and the first and second AlGaN quantum well barrier layers 432 are grown in a semipolar orientation on a semipolar plane 408.

Figure 4D:
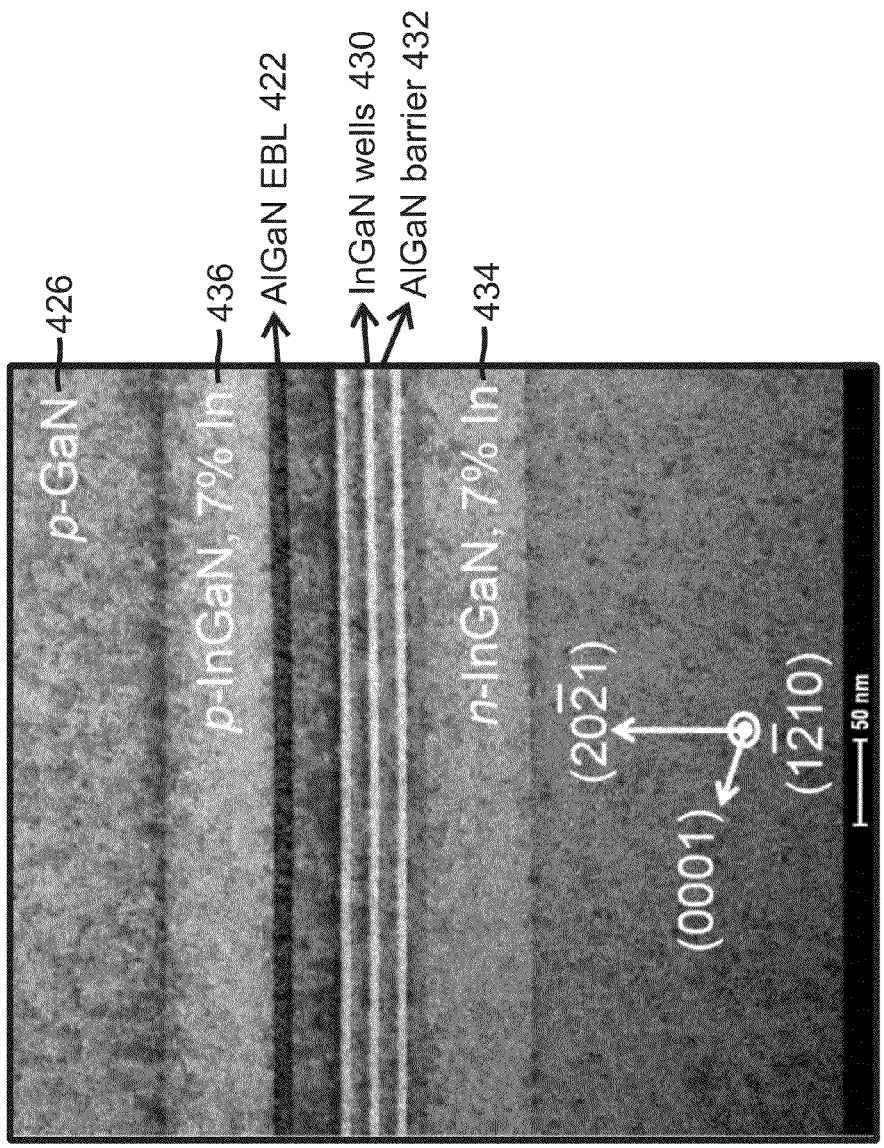
FIG. 4(d) shows a TEM image of an LD structure with AlGaN barrier and 7% InGaN SCH layers, wherein the scale is 50 nm.

FIG. 4(d) shows a TEM image of an AlGaN-cladding free laser structure according to FIG. 4(b) with n-InGaN (7% In) bulk SCH 434 and p-InGaN (7% In) bulk SCH 436 layers (instead of SL layers 418,424). Also shown are the p-GaN layer 426 EBL layer 422, and the quantum well structure (on the n-type InGaN (with 7% In) bulk SCH 434) comprising InGaN wells 430 having AlGaN barriers 432. No misfit dislocations are observed in the TEM of FIG. 4(d).

Figures 4E, 4F:
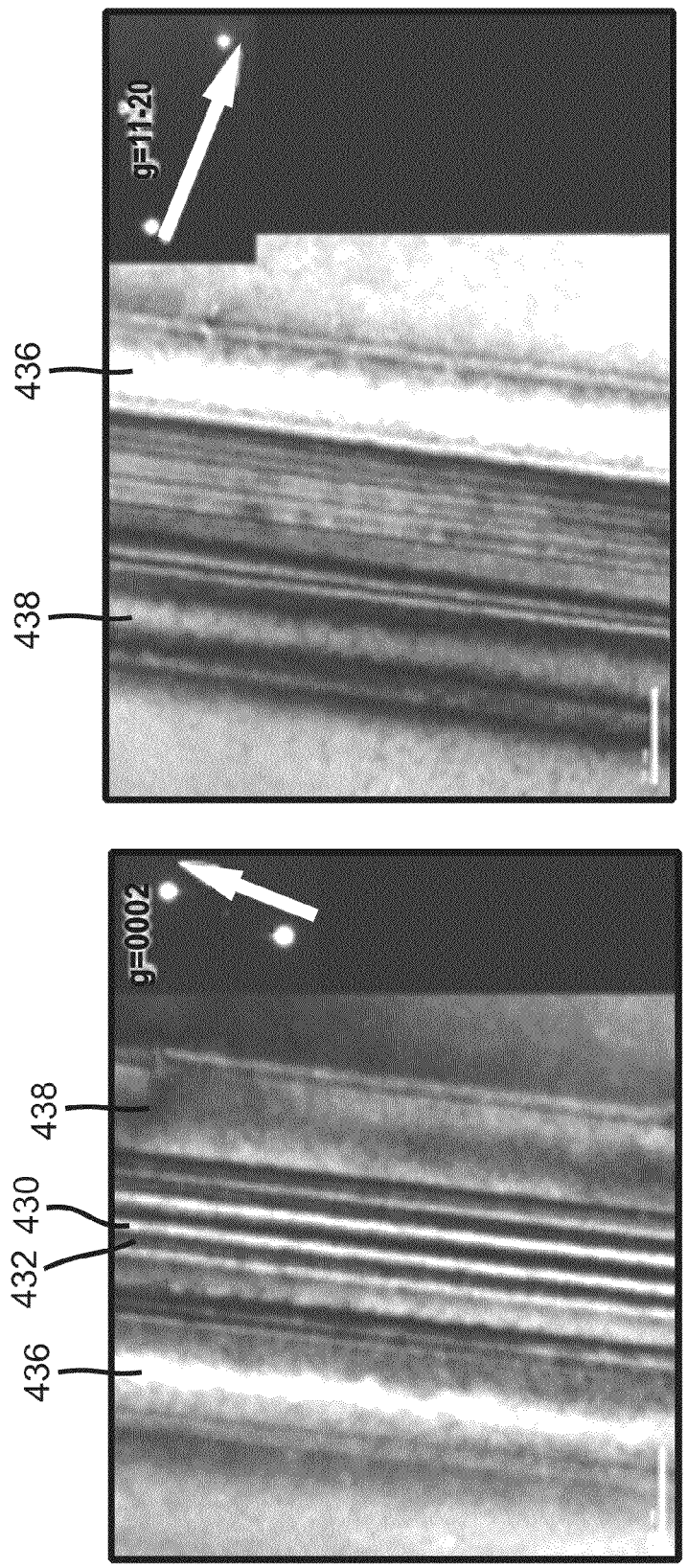

FIG. 4(e) (g=0002 along the arrow) and FIG. 4(f) (g=11-20 along the arrow) show TEM images of a LD structure according to FIG. 4(b), with n-type InGaN (7% In) bulk SCH layer 434 and p-type InGaN (7% In) bulk SCH layer 436 (instead of SL layers 418, 424), wherein the active region 420 comprises a quantum well structure on the n-type 7% InGaN bulk SCH layer 434, and the quantum well structure comprises InGaN wells 430 having AlGaN barriers 432. The TEM images of FIG. 4(e) and FIG. 4(f) show no defects (e.g., no stacking faults) and no misfit dislocations. However, in other embodiments, the stacking fault or misfit dislocation density may be less than $10^6$ cm$^{-2}$.

The Al composition of the Al containing quantum well barriers 432 may reduce or prevent misfit dislocations in the laser diode or device caused by the In composition of the lower and upper In containing guiding layers 418, 424, by compensating strain in the laser diode or device caused by the lower and upper In containing guiding layers 418,424, as compared to quantum well barrier(s) having a lower Al composition.

For example, the Al composition of the Al containing quantum well barriers 432 may reduce or prevent non luminescent defects (e.g., triangular dark defects) in the laser diode or device caused by high In composition in the quantum wells, by compensating strain in the high In composition in the quantum wells 430, as compared to quantum well barrier(s) having a lower Al composition.

FIG. 4(a) and FIG. 4(b) also illustrate the III-Nitride layers 402-406 may be epitaxially grown in a semipolar orientation or direction (e.g., 20-21 direction) 438 on the top surface 408, such that the top surface of, or interface 440 between, each layer 402-406 is a semipolar plane (e.g., the semipolar plane of surface 408).

The present invention may use Al containing quantum barrier layers, In containing quantum well layers, and In containing SCH layers. FIGS. 4(b)-(f) illustrate specific examples where the Al containing layers are AlGaN 432 and the In containing layers are InGaN 430, 418.

Block 210 represents processing the device structure into a device. For example, stripe patterns of 2 μm ridges with cavity lengths of 1200 μm may be formed in the structure of FIG. 4(a), along the in-plane projection of c-axis by conventional lithography and dry etching technique. The facets may be formed by cleaving. High reflectivity distributed Bragg reflectors (DBR), comprised of SiO$_2$ (n=1.5 at 520 nm) and Ta$_2$O$_5$ (n=2.2 at 520 nm) stacks, were deposited on the cleaved facets by a conventional sputtering process. Reflectivity of the front and rear facets at 520 nm was 97 and 99%, respectively.

In one embodiment, the device structure is a laser diode structure having an optical confinement factor of at least 3 and an output power of at least 2 mW for a drive current of 20 mA.

Steps may be omitted or added, or additional layers (e.g., n- and p-contacts and electrodes) may be added, as is known in the art in the fabrication of optoelectronic and electronic devices.

Experimental Results

Figure 1:
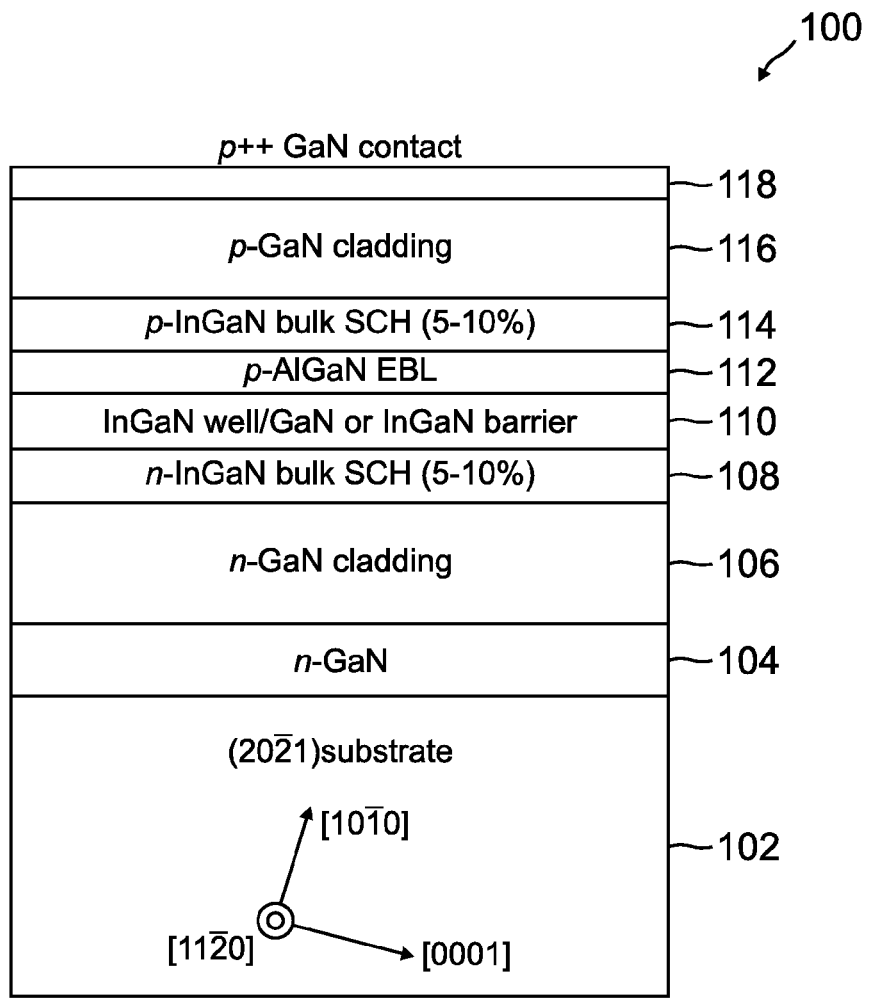
FIG. 1 shows a schematic cross-section of a LD structure according to previous technology, wherein the arrows indicate the 10-10 and 0001 directions of GaN, and the circle indicates the 11-20 direction of GaN (out of the plane of the paper).
Figures 5A, 5B:
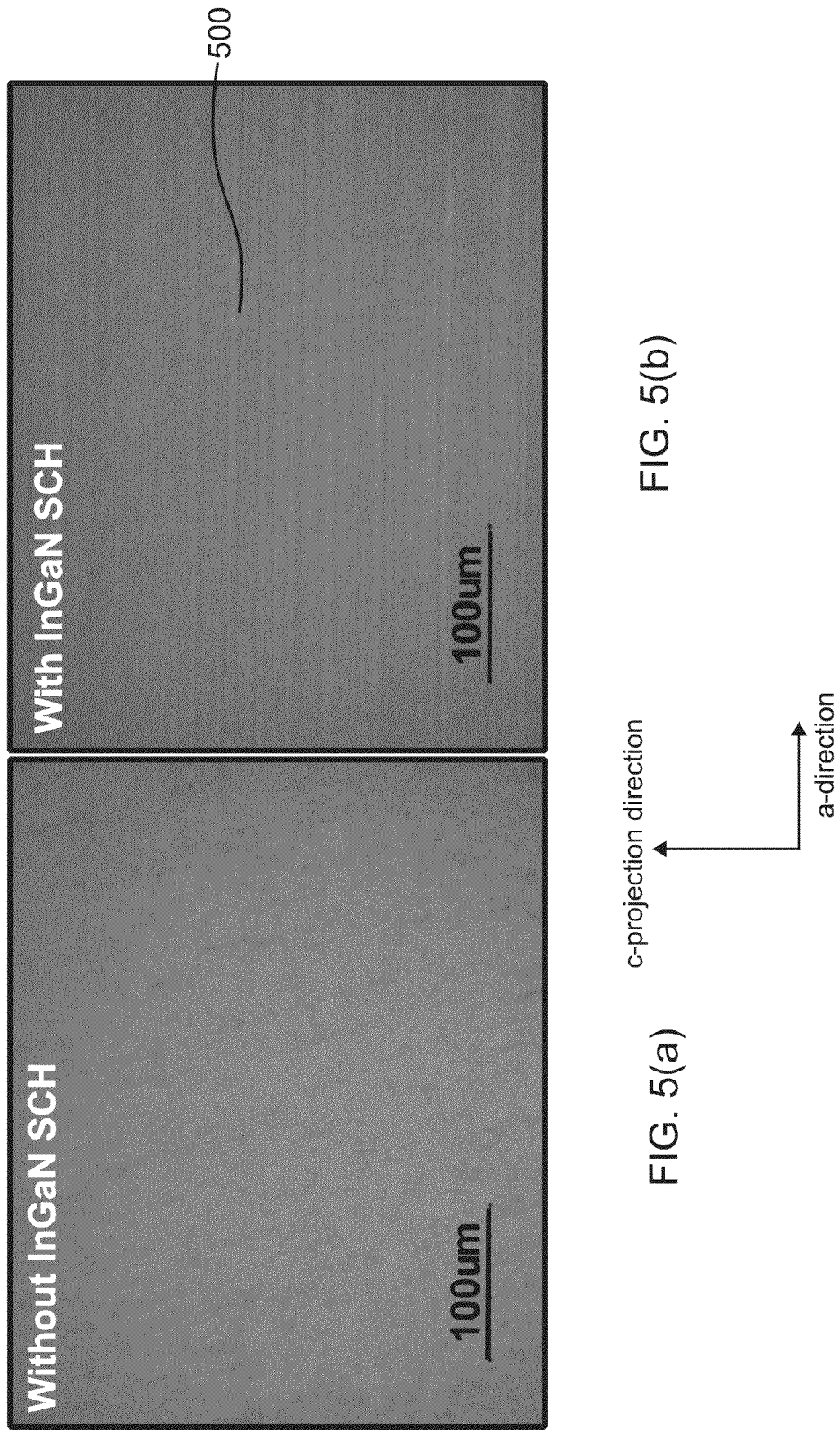
FIG. 5(a) and FIG. 5(b) show fluorescence microscope images of a laser structure without an InGaN SCH (FIG. 5(a)), and with an InGaN SCH (FIG. 5(b)), wherein black line features are shown in the case with an InGaN SCH and the scale is 100 micrometers (μm) in FIG. 5(a) and FIG. 5(b), and the c-projection direction and a-direction of the III-Nitride in the laser structure are indicated by arrows.

FIGS. 5(a) and 5(b) show fluorescence microscope images of the AlGaN-cladding-free laser structure of FIG. 1 grown on a (20-21) plane (viewing fluorescence emitted from the top side, or p$^{++}$ GaN 118 side of the laser structure). However FIG. 5(a) is an image for a laser structure of FIG. 1 without a bulk InGaN SCH 108,114, whereas FIG. 5(b) is an image for a laser structure of FIG. 1 with the bulk InGaN SCH 108,114. In both FIG. 5(a) and FIG. 5(b) the active layer 110 comprises an InGaN quantum well with GaN or InGaN barriers grown on a (20$\bar{2}$1) plane. Black line features 500 are shown in the case with a bulk InGaN SCH 108, 114 (FIG. 5(b)), but black line features are not visible in the case without the bulk InGaN SCH (FIG. 5(a)).

Figure 6A:
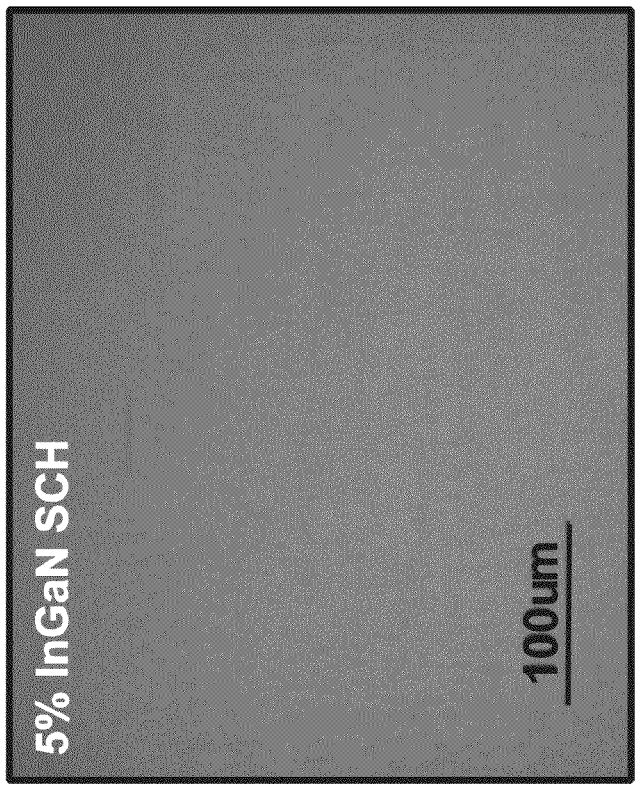
FIG. 6(a) and FIG. 6(b) show fluorescence microscope images of laser structures with a 5% InGaN SCH (FIG. 6(a)) and a 7.5% InGaN SCH (FIG. 6(b)), wherein the scale is 100 μm in FIG. 6(a) and FIG. 6(b) and the c-projection direction and a-direction of the III-Nitride in the laser structure are indicated by arrows.
Figure 6B:
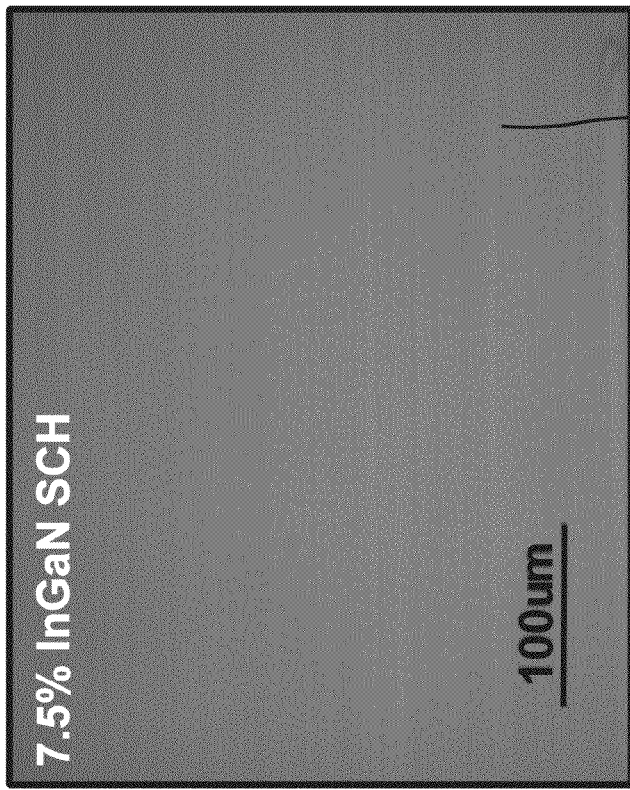

FIGS. 6(a) and 6(b) show fluorescence microscope images AlGaN-cladding-free LD structure of FIG. 1 (viewing fluorescence emitted from the top side, or p$^{++}$ GaN 118 side of the laser structure). FIG. 6(a) and FIG. 6(b) are measured for an AlGaN cladding free LD structure grown on a (20$\bar{2}$1) plane with a 5% bulk InGaN SCH 108, 114 (FIG. 6(a)) and a 7.5% bulk InGaN SCH 108, 114 (FIG. 6(b)). Black line features or defects 600 are more prominent in FIG. 6(b), showing that the number of black line features or defects 600 increases as Indium composition in the SCH 108, 114 increases (as shown by more black line defects in FIG. 6(b) as compared to FIG. 6(a)).

Higher In composition in the SCH also means higher compressive strain builds up in the whole structure resulting in black line defects formation in the active region. The AlGaN barrier can compensate this strain in the active region.

Figure 7A:
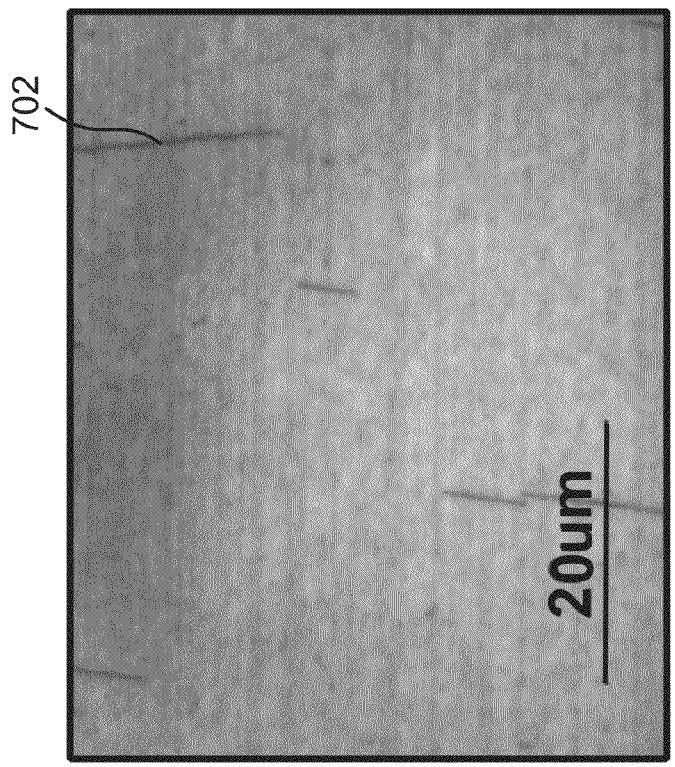
Figure 7A:
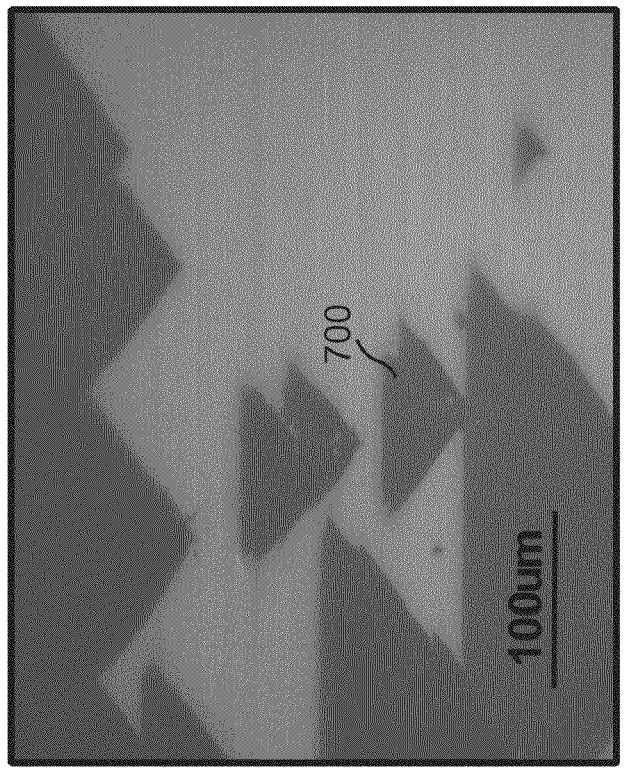

FIGS. 7(a) and 7(b) show fluorescence microscope images the AlGaN-cladding-free LD structure of FIG. 1 (viewing fluorescence emitted from the top side, or p$^{++}$ GaN 118 side of the laser structure). FIG. 7(a) and FIG. 7(b) are measured for an AlGaN cladding free LD structure grown on a (20-21) plane with a 3 period MQW comprising 3 InGaN quantum wells having a 4.5 nm thickness and 10 nm thick InGaN barriers. Large black triangle regions 700 (having reduced light output) and dark line defects 702 are visible.

Figure 8A:
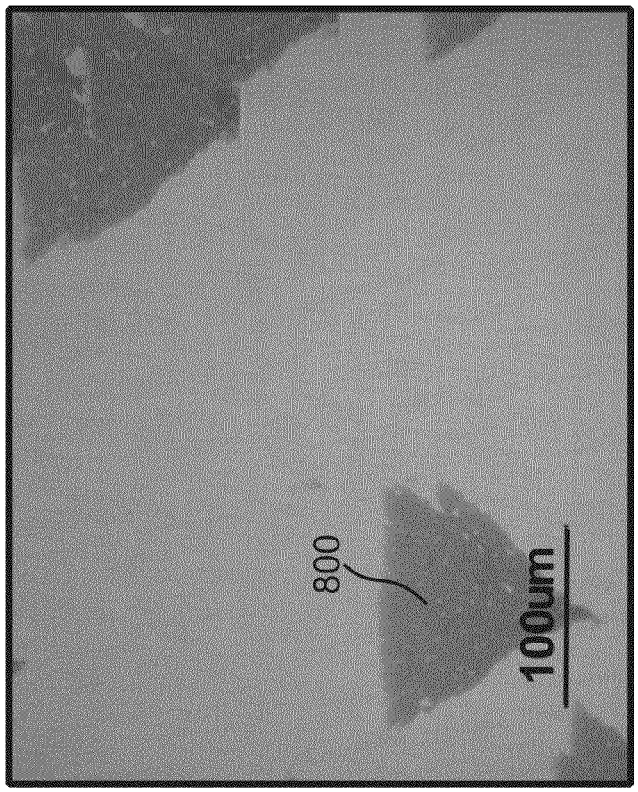
FIG. 8(a) and FIG. 8(b) show fluorescence microscope images of the AlGaN-cladding-free LD structure of FIG. 1 grown on a (20$\bar{2}$1) plane, the LD active region comprising a 5 period MQW including 5 InGaN quantum wells having a 4.5 nm thickness and 10 nm thick InGaN barriers, showing large black triangle regions (having reduced light output) and dark line defects, wherein the c-projection direction and a-direction of the III-Nitride in the laser structure are indicated by arrows, and the scale is 100 micrometers in FIG. 8(a) and 20 micrometers in FIG. 8(b).
Figure 8B:
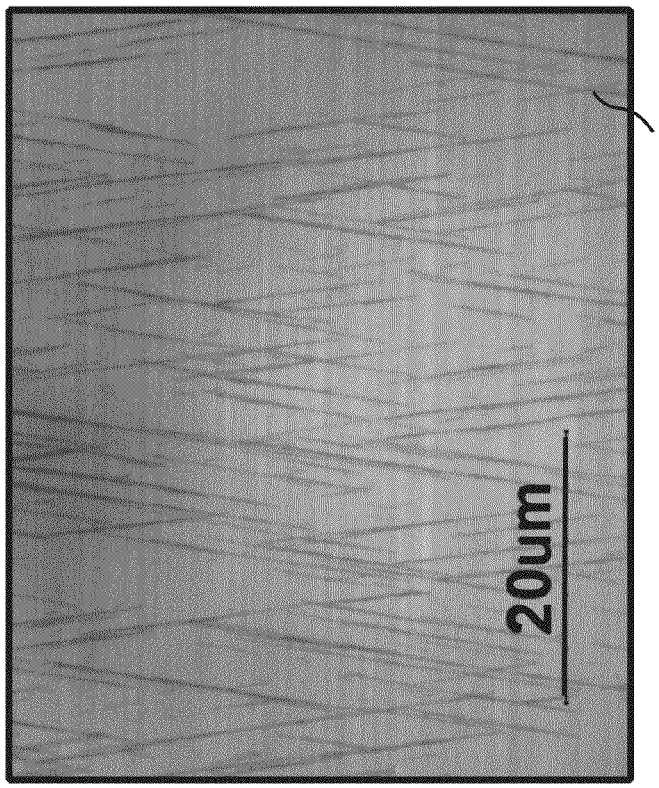

FIGS. 8(a) and 8(b) show fluorescence microscope images the AlGaN-cladding-free LD structure of FIG. 1 (viewing fluorescence emitted from the top side, or p$^{++}$ GaN 118 side of the laser structure). FIG. 8(a) and FIG. 8(b) are measured for the AlGaN cladding free LD structure grown on a (20-21) plane, with a 5 period MQW comprising 5 InGaN quantum wells having a 4.5 nm thickness and 10 nm thick InGaN barriers. Large black triangle regions 800 (having reduced light output) and dark line defects 802 are visible.

Three laser samples (Laser A, Laser B, and Laser C) using the structure of FIG. 4(b) were grown. In Laser A, the AlGaN barriers 432 were replaced with GaN barriers (GaN br), in Laser B, Al$_{0.05}$Ga$_{0.95}$N barriers 432 were used (AlGaN br) and in Laser C, the AlGaN barriers 432 were replaced with In$_{0.03}$Ga$_{0.97}$N barriers (InGaN br).

Figure 9:
FIG. 9 shows photographs of the epitaxial wafer of Laser A comprising a GaN barrier, the epitaxial wafer of Laser B comprising an AlGaN barrier, and the epitaxial wafer of Laser C comprising an InGaN barrier.

FIG. 9 shows the digital photographs of the top of Laser A, Laser B and Laser C after LD growth. The electroluminescence (EL) spontaneous emission peak wavelength of Lasers A, B, and C ranged between 520-540 nm. It is clear that Laser B (with AlGaN barriers) appears uniform at a visual scale. In contrast, large areas of Laser A (with GaN barriers) and Laser C (with InGaN barriers) were inhomogeneous (as evidenced by dark areas 900) at a visual scale. Thus, the III-Nitride device layers may form a light emitting device, wherein the active layer emits light, and the device emits the light uniformly across one or more of an entirety of a top surface, an entirety of a bottom surface, or an entirety of a sidewall of the active layer.

Figure 10A:
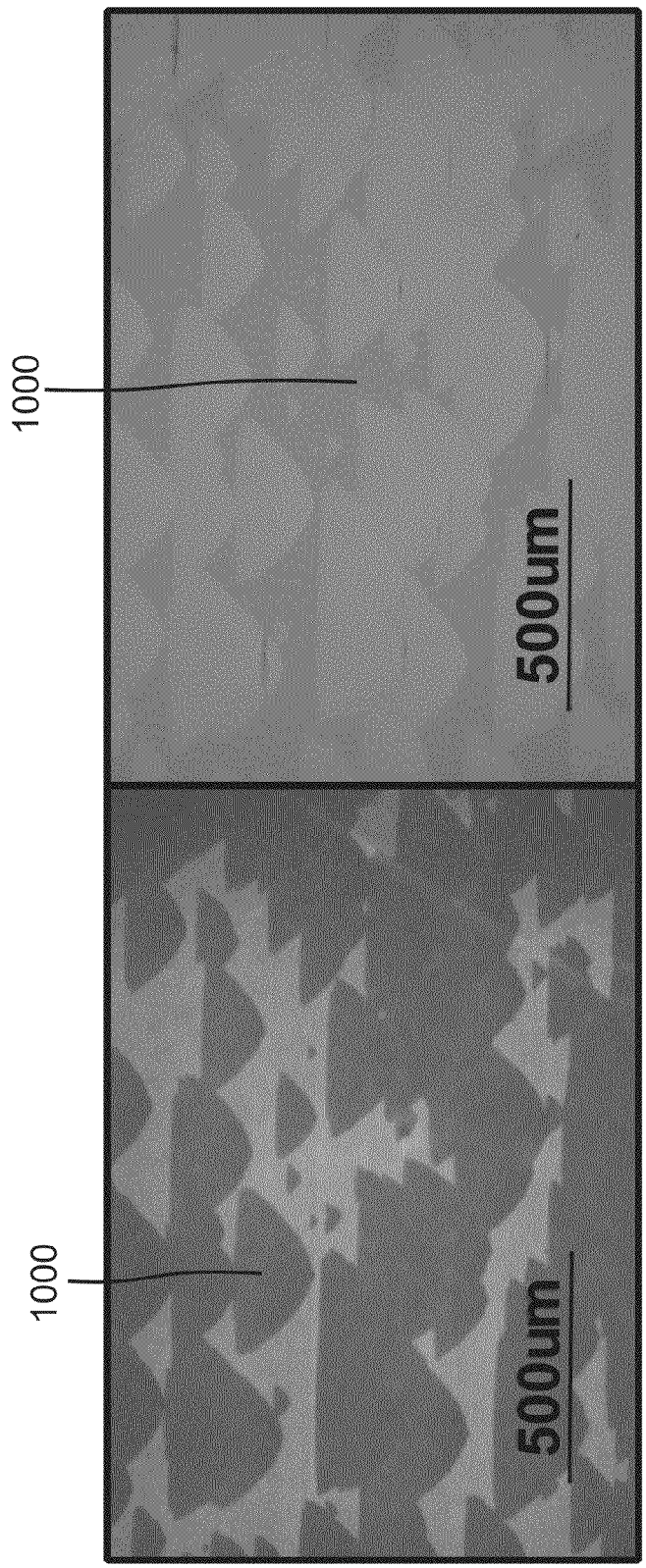
FIG. 10(a) and FIG. 10(b) show a fluorescence microscope (FLOM) image (FIG. 10(a)) and an optical microscope (OM) image (FIG. 10(b)) of the same area of Laser A, wherein the c-projection direction and a-direction of the III-Nitride in the laser structure are indicated by arrows.
Figure 10B:
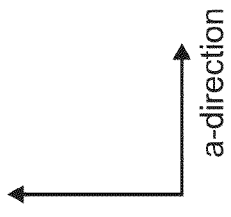

A fluorescence microscope image, and an optical microscope image, of the same area of Laser A (viewing the top side, or p$^{++}$ GaN 428 side of the laser structure), are shown in FIGS. 10(*a*) and 10(*b*), respectively. The present invention notices that non-luminescent triangular areas 1000 can be observed in both the fluorescence and optical microscope images. The triangular areas 1000 comprises of defects that presumably have a high density of nonradiative recombination centers in the QWs 430, and these defect clusters cause low output power of from the QWs 430 in the green spectral range (emission wavelength λ>515 nm).

Figure 11A:
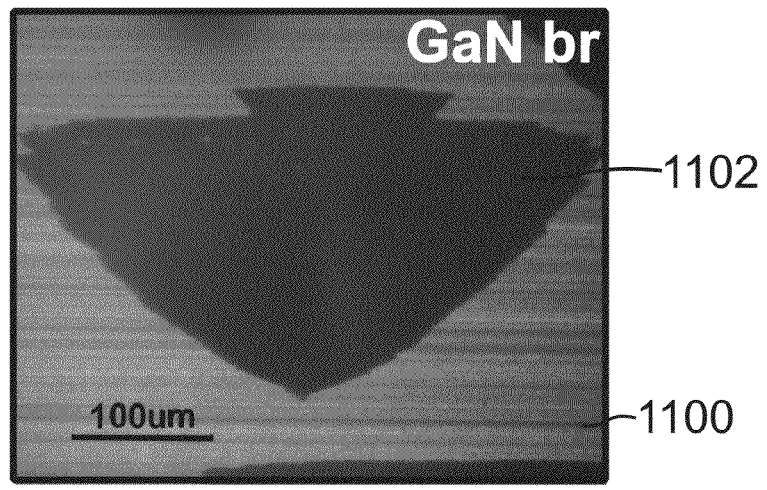
FIG. 11(a), FIG. 11(b) and FIG. 11(c) are fluorescence microscope images of Laser A, Laser B, and Laser C, respectively.
Figure 11B:
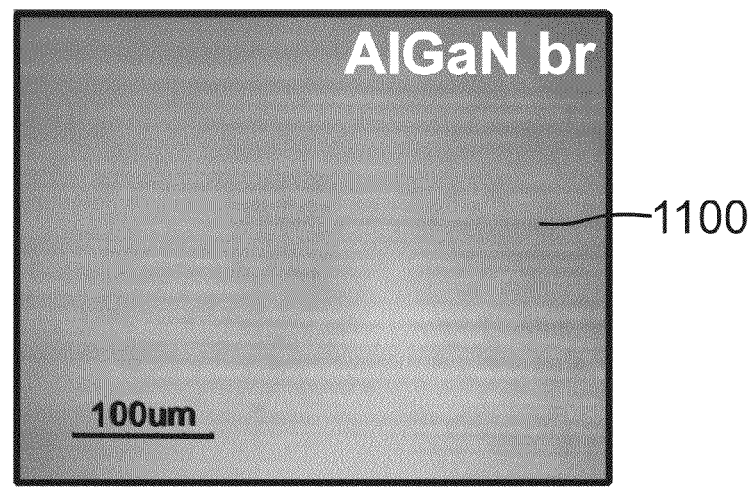
Figure 11C:
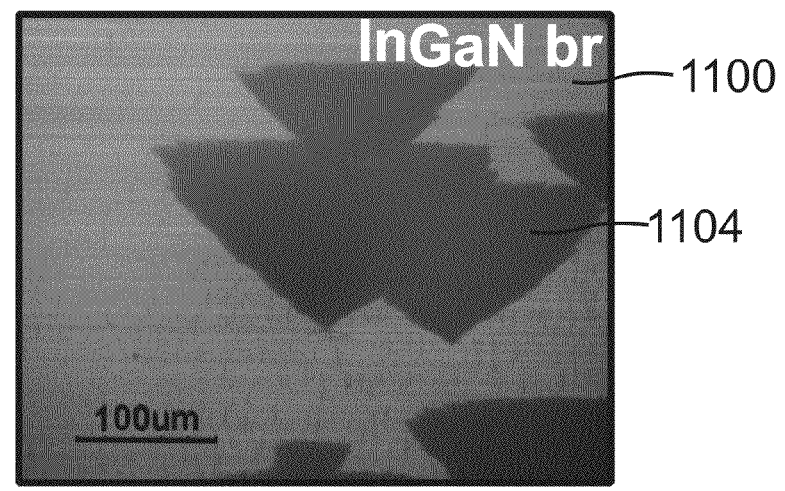

Fluorescence microscope images, viewing the top side, or p$^{++}$ GaN 428 side of the laser structure with larger magnification, of Laser A (with GaN barrier), Laser B (with AlGaN barrier) and Laser C (with InGaN barrier) are shown in FIGS. 11(*a*)-11(*c*), respectively. In FIG. 11(*b*), Laser B shows uniform QW emission without non-luminescent regions and the EL spontaneous emission peak wavelength was 527 nm. The striations 1100 along the direction [1$\bar{2}$10], common to all three LDs, appear when the epitaxial growth contains InGaN guiding layers 418,424. Compared to Laser B, the fluorescence images of Lasers A and C show large triangular non-luminescent regions 1102, 1104 which indicate lower quantum efficiency for these epitaxial wafers. Note that the scale of these triangular defects is quite large (more than 100 μm), so that the area with high quantum efficiency is significantly reduced. LDs with these triangular defects have lower internal quantum efficiency, a non-uniform emission region, and high optical loss. Accordingly, the present invention may enable devices wherein dark or non luminescent defects in the device structure have a surface area less than 100 micrometers by 100 micrometers and a density less than ~4.5×10$^3$ cm$^{-2}$.

Figure 12:
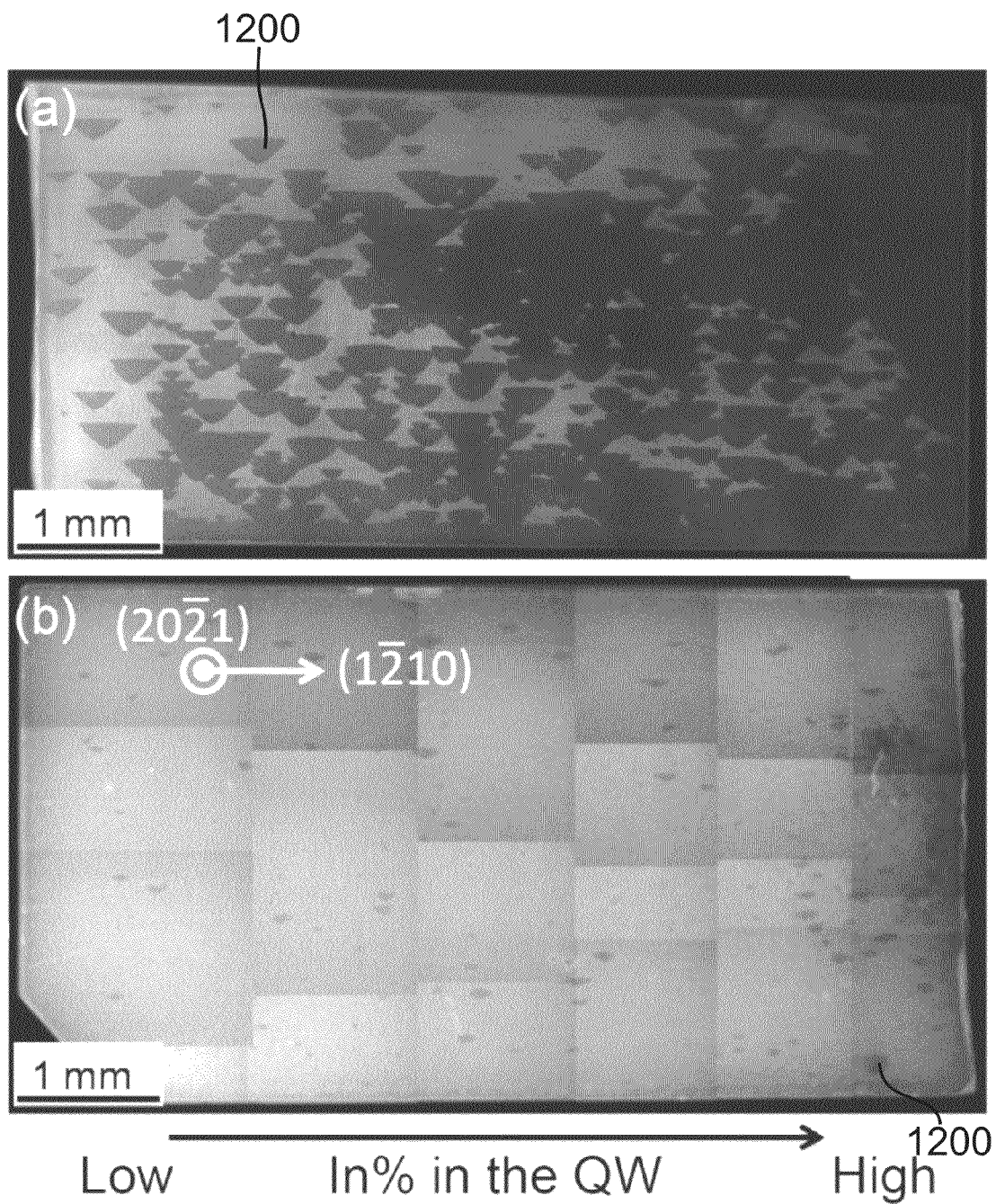
FIG. 12 shows fluorescence microscope images of (a) the whole epitaxial wafer of Laser A and (b) the whole epitaxial wafer of Laser B, wherein photoluminescence (PL) peak wavelength gradually increases from the left to the right across the wafer, as In % composition in the quantum well active regions of Laser A and Laser B increases (unintentionally) from low to high, going from left to right in FIGS. 12(a) and (b).

Fluorescence images of the whole Laser A epitaxial wafer, and the whole Laser B epitaxial wafer, are shown in FIG. 12(*a*) and FIG. 12(*b*), respectively (viewing the top side, or p$^{++}$ GaN 428 side of the laser structure). Under fluorescence microscope, the present invention identifies non-luminescent regions in Laser A comprising of many small, triangular non-luminescent features 1200, where no light is emitted. Laser B (with AlGaN barrier) has much less, and smaller, triangular non-luminescent regions 1200. In both LDs, photoluminescence (PL) peak wavelength gradually increases from the left to the right across the wafers, unintentionally, due to temperature non-uniformity on the susceptor, which indicates the indium composition in the wells 430 gradually increases from left to right across the wafers. In Laser A's case, as PL peak wavelengths increased, the number of triangular-shaped non-luminescent regions 1200 also increased. Laser B shows better emission uniformity and less triangular non-luminescent regions 1200 than Laser A, even though the average PL peak wavelength for Laser B was longer.

The orientation of triangular non-luminescent regions among all of the wafers face the same side of the wafer, which indicates triangular non-luminescent regions are crystallographic. Also, the miscut angle, toward the c-direction ($\phi_c$) of the free standing (20-21) GaN substrates, has an adverse effect on the quality of the active region in the green spectral range. Both the number and size of nonluminescent regions increases significantly when $\phi_c$>0.25°. With AlGaN barriers in the active region, a high quality active region can still be obtained even when $\phi_c$>0.45°. BPSF and misfit dislocations were observed in Laser A and Laser C by TEM analysis.

FIGS. 13(*a*)-(*c*) show fluorescence microscope images of another sample (viewing the top side, or p$^{++}$ GaN 428 side of the laser structure) having the laser structure of FIG. 4(*a*) with a GaN barrier (FIG. 13(*a*)), with the GaN barrier replaced with an InGaN barrier (FIG. 13(*b*)), and the GaN barrier replaced with (c) an AlGaN barrier (FIG. 13(*c*)). FIGS. 13(*a*)-(*c*) confirm the AlGaN-barriers were effective at preventing triangular nonradiative defects 1300.

Figure 14:
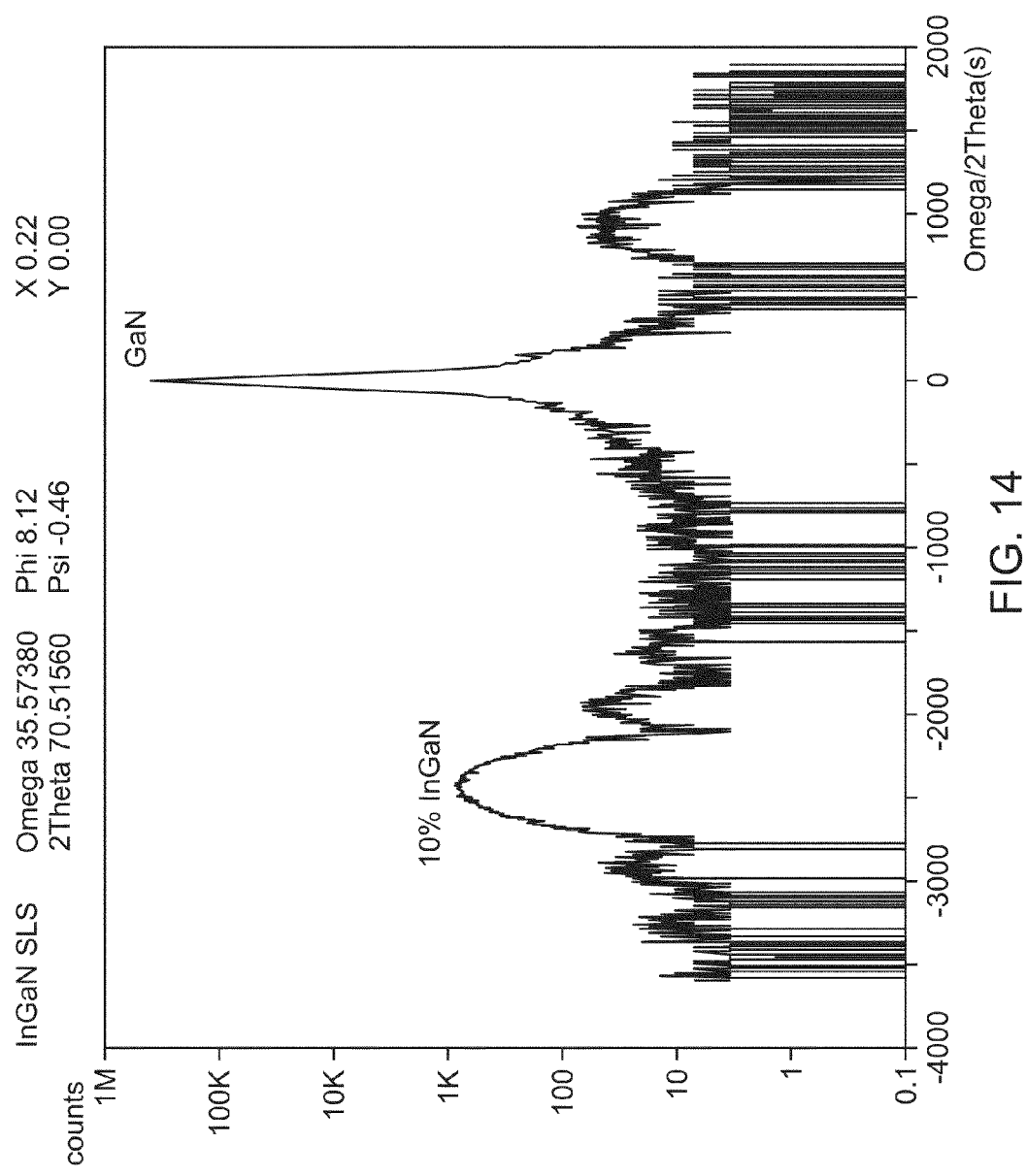
FIG. 14 shows an X-ray Diffraction (XRD) scan of an InGaN superlattice SCH layer (In %=10%), plotting counts (1 k=1000, 1 M=$10^6$) vs. Omega/2Theta.
Figure 15:
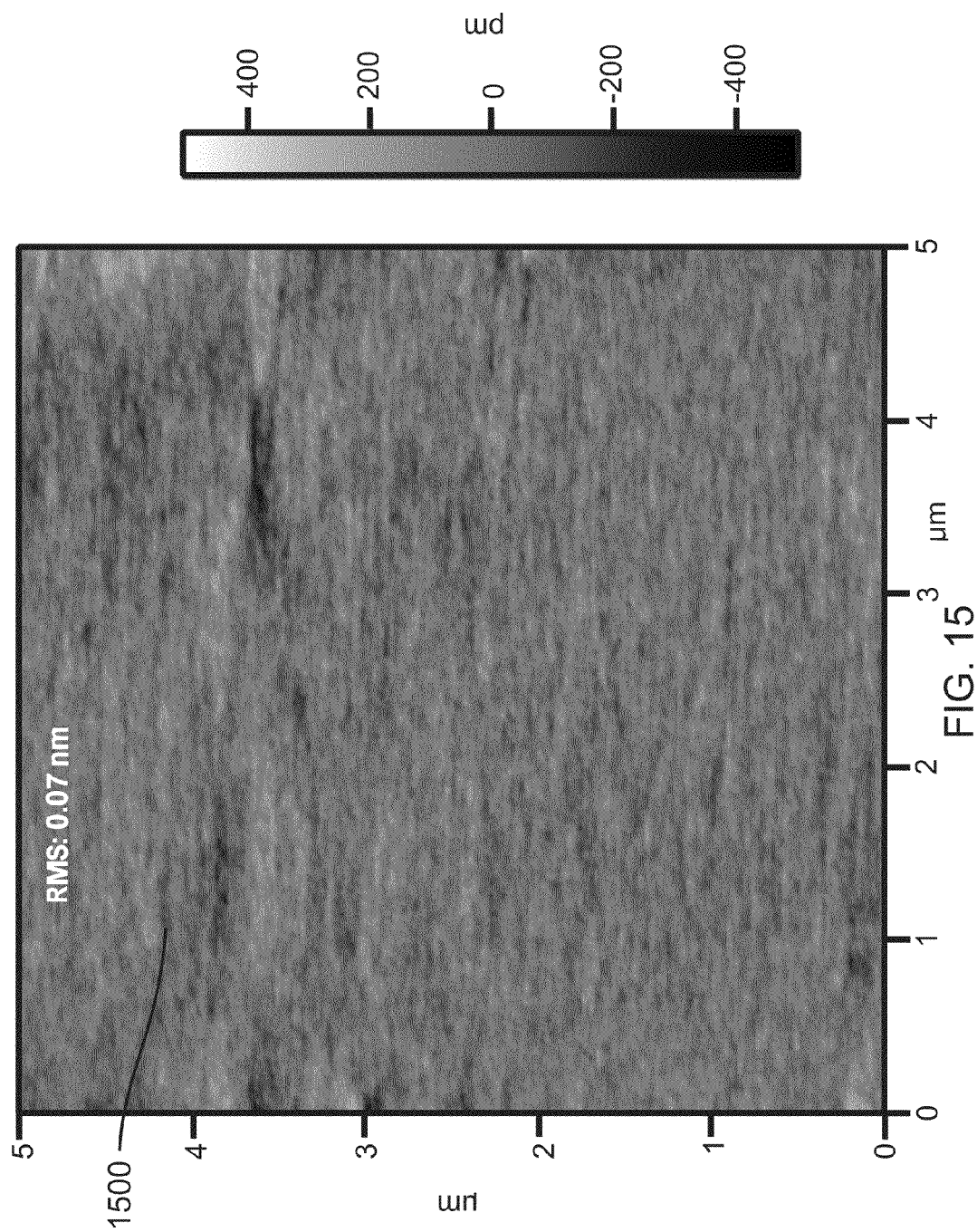
FIG. 15 shows an Atomic Force Microscope (AFM) scan of an InGaN superlattice SCH layer (In %=10%), wherein the grayscale units are picometers (pm).

FIG. 14 shows an XRD scan, and FIG. 15 shows an AFM scan of an InGaN superlattice SCH layer (In %=10%), wherein root mean square (RMS) surface roughness in FIG. 15 is 0.07 nm over the area of 5 μm×5 μm. Thus, one or more, or all of the III-Nitride device layers 402-406 of the device structure of FIG. 4(*a*) or FIG. 4(*b*) may have a top surface 440 with a RMS roughness of less than 0.07 nm. The surface 1500 shown in FIG. 15 is the top surface of layer 418 and is a (20-21) semipolar plane.

The clear fringe peaks in the XRD scan indicate good crystal quality and coherent growth of the SCH film.

Figure 16:
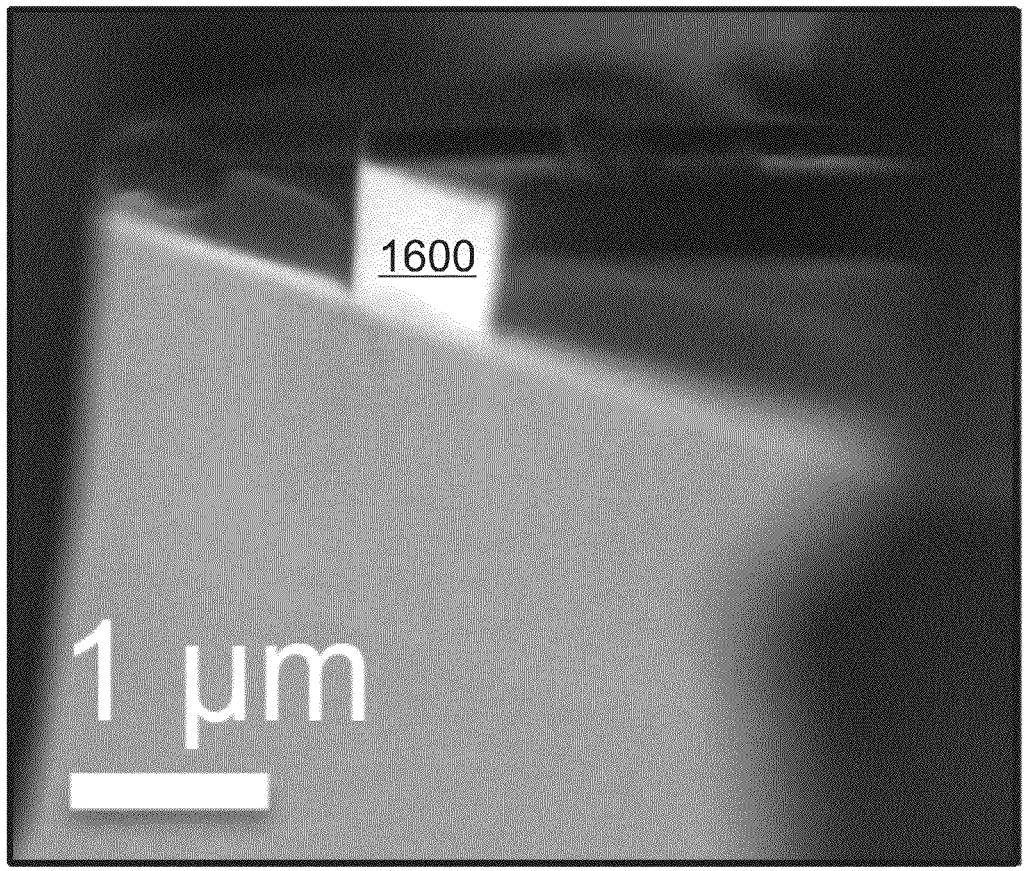
FIG. 16 shows a scanning electron microscope (SEM) image of representative cleaved facets of the laser devices.

FIG. 16 shows an SEM image of the representative cleaved facets 1600 of the laser devices, showing the LD may further comprise a laser cavity bounded by two mirrors. However, the LD is not limited to cleaved mirrors, the mirrors may be etched, for example (e.g., by dry etching).

Figure 17:
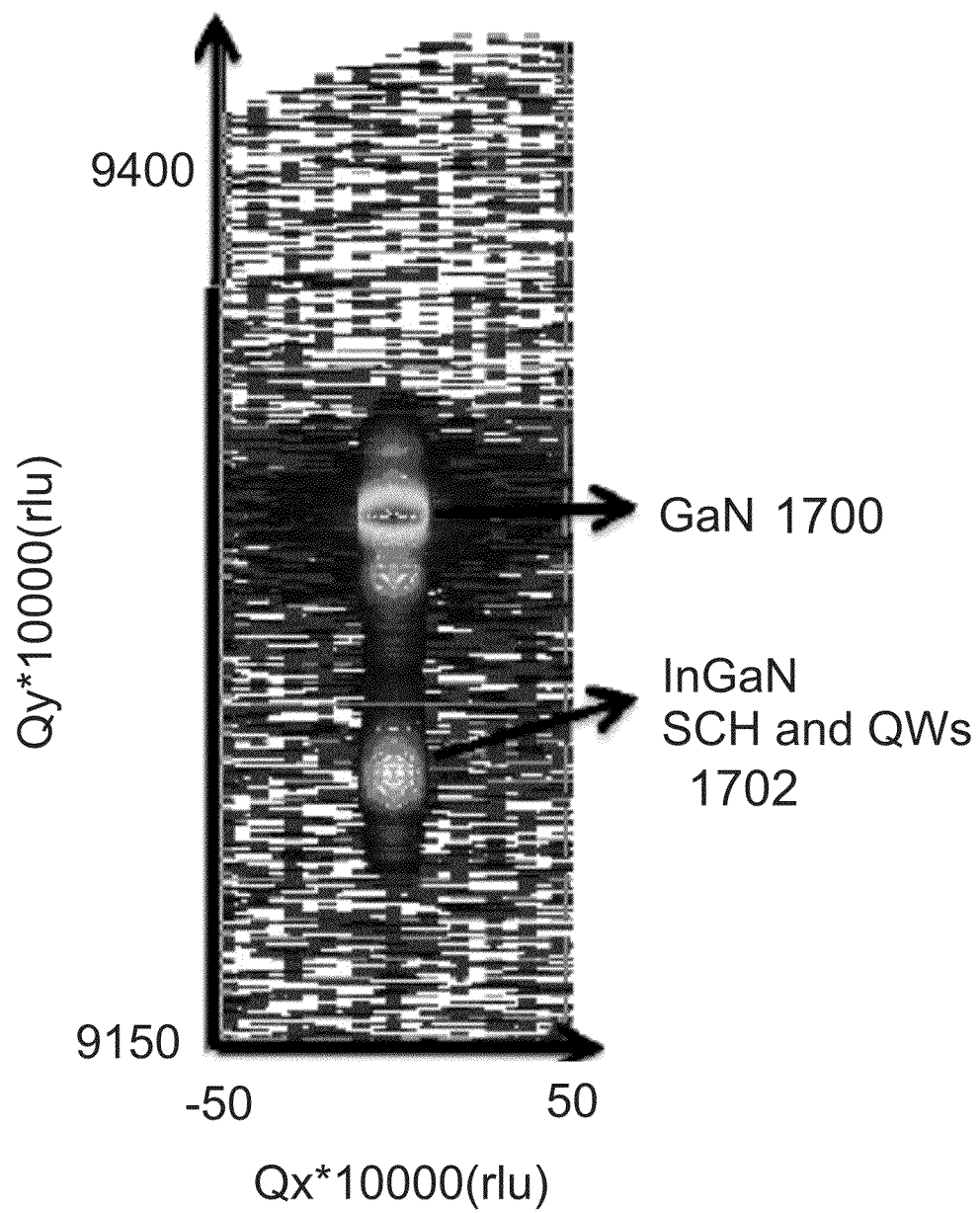
FIG. 17 shows reciprocal lattice mapping of Laser B.

FIG. 17 shows reciprocal lattice mapping of Laser B, showing mapping of GaN 1700 and InGaN SCH and QWs 1702, and confirming coherent growth. Coherent growth without stacking faults or misfit dislocations was observed in TEM image of FIG. 4(*c*).

Figure 18:
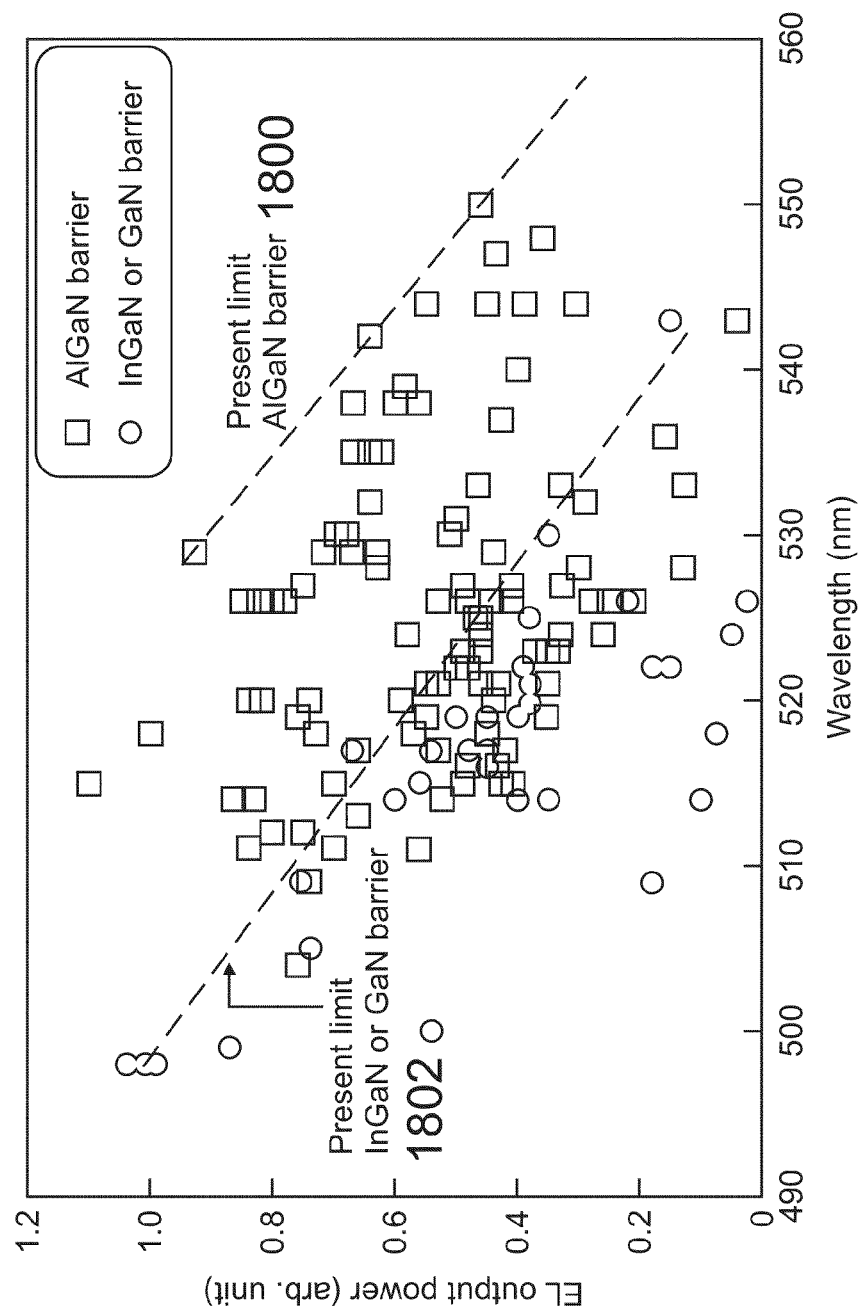
FIG. 18 shows the dependence of electroluminescent output power vs emission peak wavelength (nanometers, nm), for the laser epitaxial wafers with InGaN barrier, GaN barrier, and AlGaN barrier.

FIG. 18 shows the scatter plot of EL output power as a function of wavelength of the laser epitaxial wafers. The epitaxial wafers with AlGaN barriers 432 have higher EL output power and a higher present upper limit 1800 than the present upper limit 1802 for wafers with InGaN or GaN barriers. The use of AlGaN barriers 432 provides a pathway to high internal quantum efficiency for emission in the green and yellow spectrum regions. The effect of AlGaN barriers 532 on the elimination of non-emission regions is significant for PL peak wavelengths longer than 515 nm.

Laser B was processed into devices using stripe patterns of 2 μm ridges with cavity lengths of 1200 μm formed in the structure of FIG. 4(*a*), along the in-plane projection of c-axis by conventional lithography and dry etching technique. The facets were formed by cleaving. High reflectivity distributed Bragg reflectors (DBR), comprising of SiO$_2$ (n=1.5 at 520 nm) and Ta$_2$O$_5$ (n=2.2 at 520 nm) stacks, were deposited on the cleaved facets by a conventional sputtering process. Reflectivity of the front and rear facets at 520 nm was 97 and 99%, respectively.

Figure 19:
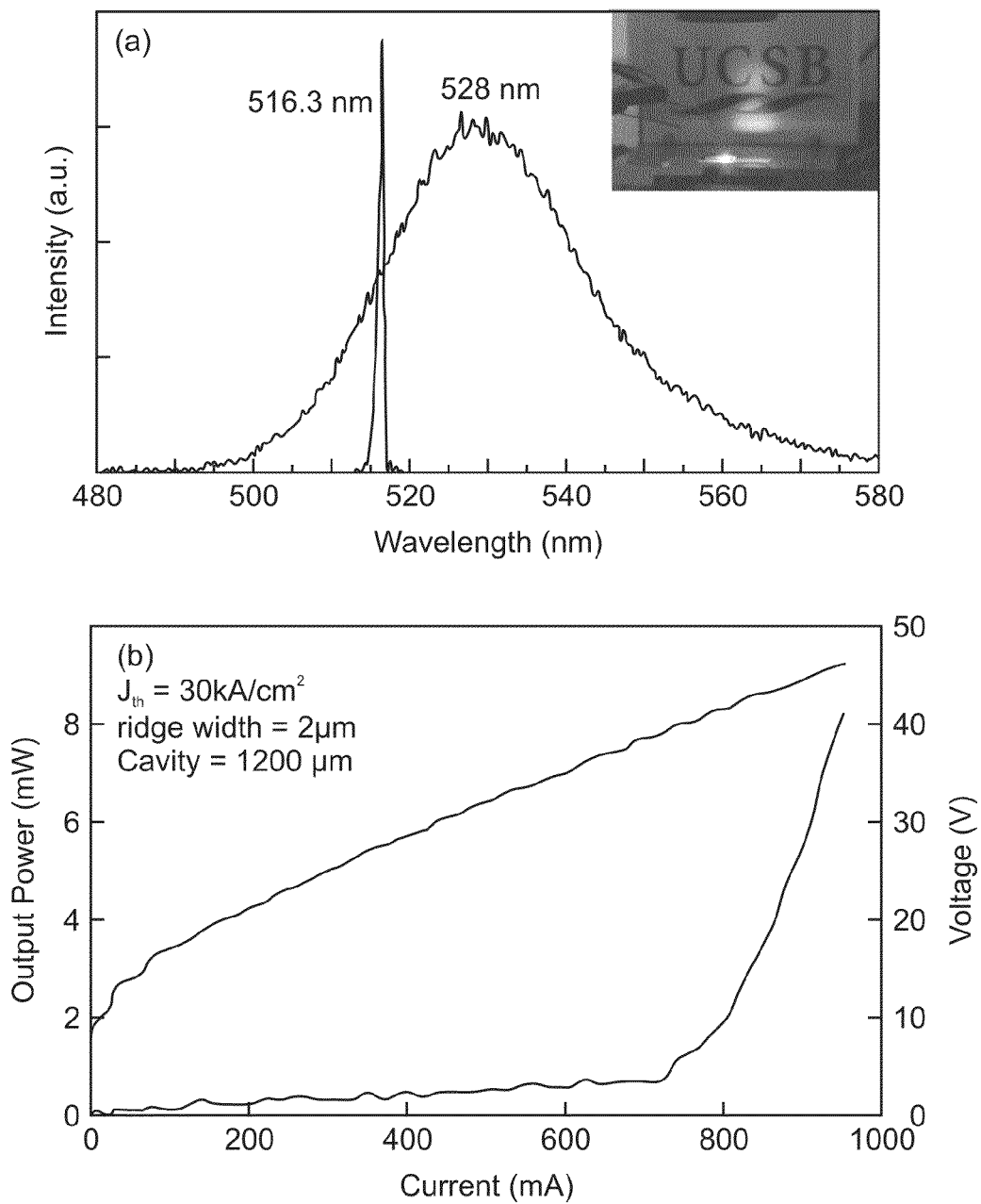
FIG. 19(a) shows representative spectra of spontaneous emission, as a function of drive current of 20 mA, and 516 nm stimulated emission for drive current of I>$I_{th}$, (for the laser with AlGaN barriers, plotting intensity of emission (arbitrary units, a.u.) as a function of emission wavelength (nanometers, nm), wherein the inset is a picture of the far field emission pattern from the 516 nm laser diode (LD).
FIG. 19(b) shows light output power-injected current-voltage (LIV) curves of LDs with a ridge width of 2 μm and the cavity length of 1200 μm after facet coating and under pulsed operation (duty cycle=0.01%), plotting output power (milliwatts, mW) and voltage (V), as a function of drive current (milliamps, mA) supplied to the LD.

FIGS. 19(*a*) and 19(*b*) show a lasing spectrum and the light output power-injected current-voltage (LIV) curves of Laser B, respectively, for a laser ridge width of 2 μm under pulsed operation (0.01% duty cycle) and a cavity length of 1200 micrometers. FIG. 19(*a*) plots representative spectra of spontaneous emission, for a drive current of 20 mA, and stimulated emission, for a drive current of I>I$_{th}$. The spontaneous emission peak at low current 20 mA and the lasing wavelength were 528 and 516 nm, respectively. FIG. 19(*b*) shows the threshold current was 720 mA, corresponding to a threshold current density of a 30 kA/cm². The spontaneous emission spectrum of FIG. 19(a) illustrates the present invention enables emission from an optoelectronic device with a peak wavelength of at least 528 nm.

Figure 20:
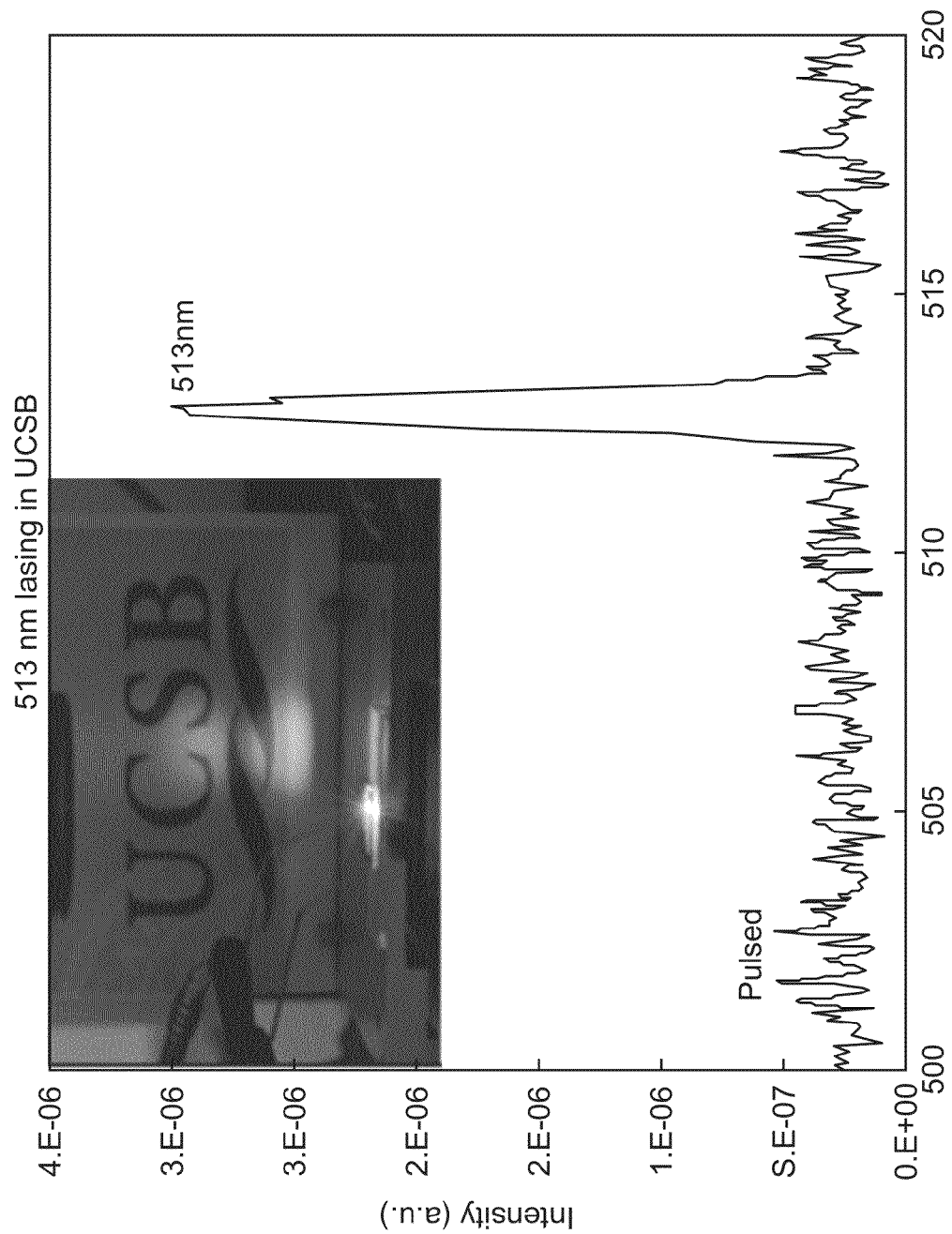
FIG. 20 shows that 513 nm lasing was achieved by using an embodiment of the present invention, showing output intensity of the laser in arbitrary units (a.u.), as a function of wavelength in nm, and the inset is a photograph of the laser structure emitting light.

FIG. 20 shows lasing from another LD sample having the structure of FIG. 4(b) and an AlGaN barrier 432, wherein 513 nm lasing was achieved. Thus, the present invention discloses a LD that produces lasing at a peak wavelength greater than 500 nm, e.g., at a wavelength of at least 513 nm, for example.

Figure 21:
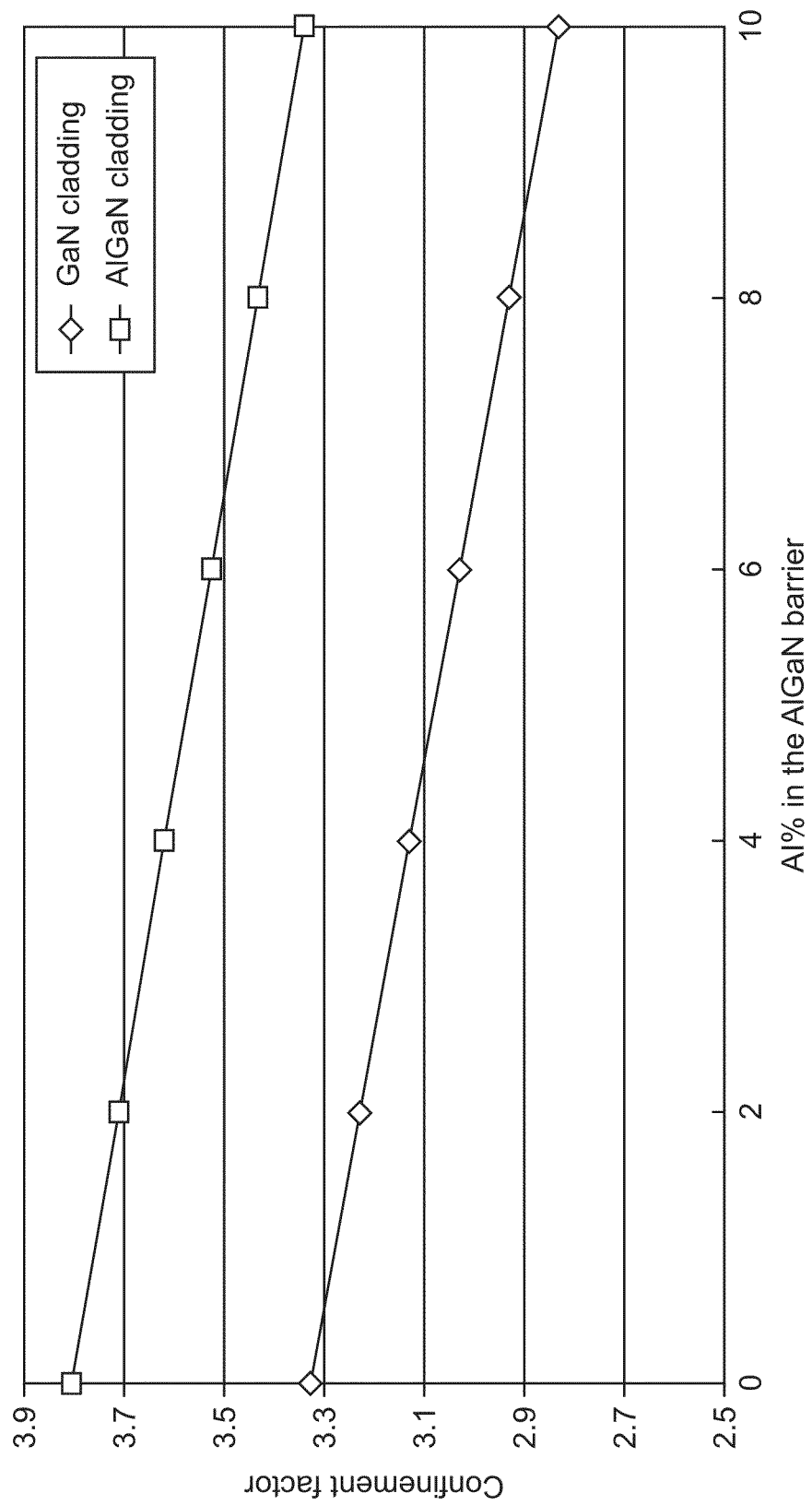
FIG. 21 is a calculation plotting confinement factor of the LD of FIG. 4(b) as a function of Al % composition in the AlGaN barrier layer.

Based on the simulation of FIG. 21, the estimated optical confinement factor was 3.33% with GaN barrier and 50 nm n- and p-$In_{0.1}Ga_{0.9}N$ guiding layers. The optical confinement factors change from 3.33 to 2.83% as the Al % in the barriers varies from 0 to 10%. According to the simulation, to further improve optical confinement, the indium content in the guiding layers may be increased and the aluminum content in the barriers may be minimized in order to obtain a high quantum efficiency active region. The present invention confirmed the minimum Al composition required in the AlGaN barrier was 3% to improve the emission uniformity and internal efficiency. However, the present invention is not limited to this Al composition and the results of this simulation.

The above experimental results show that a goal of the present invention, to achieve smooth interfaces and surface morphology, together with a highly efficient active region, and uniform and smooth guiding layers, has been achieved.

1. The use of AlGaN layers (1-5% Al), as the strain compensation layer and barriers between wells, which compensate the strains from high In composition quantum wells and SCH layers, resulted in nonradiative defect reduction and uniform quantum well emission in the green emission region. With an AlGaN barrier, a higher In composition SCH can be used in the laser structure.

2. The use of high In-content $In_xGa_{1-x}N$/GaN superlattice SCHs (x=5-25%), grown at similar temperatures as compared to InGaN bulk SCHs, resulted in a smooth and defect free wave-guiding layers. The average In-content may range from 8-15%.

The present invention employed GaN cladding layers. For typical LD structures, the number of QW periods can range from 2 to 6, the well width can range from 2 to 8 nm, and the barrier width from 6 to 15 nm. A typical thickness for the last barrier is 5 to 20 nm. The last barrier may be followed by an AlGaN electron blocking layer (EBL), for which the typical thickness and Al concentration ranges from 6-20 nm and 10-25%, respectively. The AlGaN EBL is typically doped with Mg.

In one embodiment, as shown in FIG. 4(b), the present invention is used along with a (20-21)-plane AlGaN cladding-free structure, especially for emission in the green spectral region.

Possible Modifications

The following possible modifications may be made to the present invention:

1. The present invention may be applied to polar, nonpolar and semipolar LDs.

2. The present invention may be applied to any light emitting device emitting any wavelength, ranging from the ultraviolet (UV) to the green spectral range, and longer wavelengths, for example.

3. The present invention may be applied to LD structures containing InGaN, GaN, or AlInGaN SCH layers.

4. The lower cladding layer may be a quaternary alloy (AlInGaN) or ternary AlGaN layer, instead of a GaN layer.

5. An asymmetric design may use a difference in AlGaN composition between the lower and upper cladding.

6. An asymmetric design may also include a structure with different InGaN composition for the lower and upper SCH layers.

7. An asymmetric design may also include a structure with different InGaN superlattice and InGaN bulk layers for the lower and upper SCH layers.

8. Other semipolar orientations (e.g., semipolar planes on which the LD is grown) include, but are not limited to, 20-21, 11-22, 30-31, 30-3-1, 10-1-1, (n 0-n 1), and (n 0-n-1) planes (n is an integer), etc. This is because step growth (e.g., planar growth), smooth surfaces, and smooth quantum wells, are possible on these planes. Accordingly, the semi-polar plane 408 may be planar. One or more of the III-Nitride device layers may be planar layers. For example, one or more of the III-Nitride layers may have a top surface that is planar. One or more of the III-Nitride layers may have interfaces (with other III-Nitride layers) that are planar.

9. The LD mirrors may be etched by dry etching or cleaving. Cleaved mirrors are preferable for mass-production, but etched mirrors are preferable to guarantee vertical facets in the case of semipolar GaN.

10. The Al % (% composition) in the barrier may be 0<x<5%. Higher Al composition in the barrier is less suitable because AlGaN barriers cause smaller refractive index, which reduces optical confinement.

11. The InGaN guiding layer may be a bulk or InGaN/GaN or InGaN/AlGaN super-lattice (SL) structure comprising different In compositions. Bulk is easy to grow and suitable for mass-production. However, a SL can increase critical thickness, so the present invention can increase average In composition of the guiding layer without misfit dislocations, thereby enhancing optical confinement.

12. The present invention has described AlGaN barrier layers and SCH layers in LDs. SCH layers (e.g., InGaN SCH layers) are typically (although not necessarily) used in LDs, however, AlGaN barrier layers can be used not only in LDs but also in other optoelectronic devices such as light emitting diodes (LEDs). Therefore, as well as LDs, LEDs may be fabricated using the present invention. Variations also include other optoelectronic devices (photonic crystal lasers, solar cells, photodetectors, superluminescent diodes (SLDs), semiconductor amplifiers, Vertical Cavity Surface Emitting Lasers (VCSEL), and transistors (e.g., High Electron Mobility Transistor). The present invention is not limited to a particular or thickness or composition of the III-Nitride layers. The present invention is not limited to a particular number or thickness of the quantum wells and barriers, although a thickness of the quantum well greater than 4 nm is preferable.

13. Devices may be grown using growth methods other than MOCVD, including, but not limited to, molecular beam epitaxy (MBE) and hydride vapor phase epitaxy (HVPE), for example.

It is not intended for the present invention to be bound by any particular scientific theory presented herein.

Advantages and Improvements

The present invention has the following advantages and improvements as compared to conventional (20$\bar{2}$1)-plane laser diode structures:

1. The use of AlGaN barrier layers resulted in reduction of large scale triangular defects in the green light emitting quantum wells.

2. The use of AlGaN barrier layers resulted in smooth surface morphology and uniform quantum emission, with higher In composition bulk SCH layers (In %>7%).

3. The use of InGaN superlattice SCH layers allowed growth of high In containing InGaN layers.

4. The use of an asymmetric InGaN SPSLS allowed growth of high In containing InGaN layers.

REFERENCES

The following references are incorporated by reference herein.

[1] S. Nakamura, M. Senoh, S. Nagahama, N. Iwasa, T. Yamada, T. Matsushita, H. Kiyoku, and Y. Sugimoto: Jpn. J. Appl. Phys. 35 (1996) L74.

[2] A. Avramescu, T. Lermer, J. Müller, C. Eichler, G. Bruederl, M. Sabathil, S. Lutgen, and U. Strauss: Appl. Phys. Express 3 (2010) 061003.

[3] J. S. Speck and S. F. Chichibu: MRS Bull. 34 (2009) 304.

[4] H. Ohta and K. Okamoto: MRS Bull. 34 (2009) 324.

[5] K. M. Kelchner, Y. D. Lin, M. T. Hardy, C. Y. Huang, P. S. Hsu, R. M. Farrell 1, D. A. Haeger, H. C. Kuo, F. Wu, K. Fujito, D. A. Cohen, A. Chakraborty, H. Ohta, J. S. Speck, S. Nakamura, and S. P. DenBaars: Appl. Phys. Express 2 (2009) 071003.

[7] K. C. Kim, M. C. Schmidt, H. Sato, F. Wu, N. Fellows, Z. Jia, M. Saito, K. Fujito, S. Nakamura, S. P. DenBaars, and J. S. Speck: Appl. Phys. Lett. 91 (2007) 181120.

[8] Y. D. Lin, A. Chakraborty, S. Brinkley, H. C. Kuo, T. Melo, K. Fujito, J. S. Speck, S. P. DenBaars, and S. Nakamura: Appl. Phys. Lett. 94 (2009) 261108.

[9] S. H. Park and D. Ahn: Appl. Phys. Lett. 90 (2007) 013505.

[10] S. H. Park and D. Ahn: IEEE J. Quantum Electron. 43 (2007) 1175.

[11] M. Kubota, K. Okamoto, T. Tanaka, and H. Ohta: Appl. Phys. Express 1 (2008) 011102.

[12] K. Okamoto, T. Tanaka, and M. Kubota: Appl. Phys. Express 1 (2008) 072201.

[13] Y. Tsuda, M. Ohta, P. O. Vaccaro, S. Ito, S. Hirukawa, Y. Kawaguchi, Y. Fujishiro, Y. Takahira, Y. Ueta, T. Takakura, and T. Yuasa: Appl. Phys. Express 1 (2008) 011104.

[14] Y. D. Lin: Dr. Thesis, Electrical and Computer Engineering Department, University of California, Santa Barbara (2010).

[15] Y. D. Lin, M. T. Hardy, P. S. Hsu, K. M. Kelchner, C. Y. Huang, D. A. Haeger, R. M. Farrell, K. Fujito, A. Chakraborty, H. Ohta, J. S. Speck, S. P. DenBaars, and S. Nakamura: Appl. Phys. Express 2 (2009) 082102.

[16] K. Okamoto, J. Kashiwagi, T. Tanaka, and M. Kuboto: Appl. Phys. Lett. 94 (2009) 071105.

[17] F. Wu, Y. D. Lin, A. Chakraborty, H. Ohta, S. P. DenBaars, S. Nakamura, and J. S. Speck: Appl. Phys. Lett. 96 (2010) 231912.

[18] Y. Enya, Y. Yoshizumi, T. Kyono, K. Akita, M. Ueno, M. Adachi, T. Sumitomo, S. Tokuyama, T. Ikegami, K. Katayama, and T. Nakamura: Appl. Phys. Express 2 (2009) 082101.

[19] J. W. Raring, E. M. Hall, M. C. Schmidt, C. Poblenz, B. Li, N. Pfister, D. F. Feezell, R. Craig, J. S. Speck, S. P. DenBaars, and S. Nakamura: Proc. SPIE 7602 (2010) 760218.

[20] A. Tyagi, R. M. Farrell, K. M. Kelchner, C. Y. Huang, P. S. Hsu, D. A. Haeger, M. T. Hardy, C. Holder, K. Fujito, D. Cohen, H. Ohta, J. S. Speck, S. P. DenBaars, and S. Nakamura: Appl. Phys. Express 3 (2009) 011002.

[21] A. Tyagi, F. Wu, E. C. Young, A. Chakraborty, H. Ohta, R. Bhat, K. Fujito, S. P. DenBaars, S. Nakamura, and J. S. Speck: Appl. Phys. Lett. 95 (2009) 251905.

[22] C. Y. Huang, Y. D. Lin, A. Tyagi, A. Chakraborty, H. Ohta, J. S. Speck, S. P. DenBaars, and S. Nakamura: J. Appl. Phys. 107 (2010) 023101.

[23] Yoshizumi et al., Applied Physics Express 2 (2009) 092101.

[24] Powerpoint slides by You-Da Lin, entitled "Development of 516 nm green LDs for m-plane and semipolar GaN" Solid State Lighting and Energy Center Annual Review, University of California, Santa Barbara, Nov. 5, 2010.

[25] You-Da Lin et. al., "High Quality InGaN/AlGaN Multiple Quantum Wells for Semipolar InGaN Green Laser Diodes," Applied Physics Express 3 (2010) 082001.

[26] Tyagi et al., Applied Physics Express 3 (2010) 011002.

[27] Chakraborty et. al., U.S. Patent Publication No. US 2010/0309943, published Dec. 9, 2010, entitled "Long Wavelength Nonpolar and Semipolar (Al, Ga, In)N based laser diodes."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of using an Aluminum (Al) containing barrier layer in a quantum well structure of a device, comprising:
    determining one or more acceptable amounts of one or more defects selected from misfit dislocations, stacking faults, and triangular dark defects, and triangular non-luminescent defects;
    selecting one or more Al compositions to obtain the amounts of the one or more defects;
    depositing, in a quantum well structure of a device, one or more Al containing barrier layers having the one or more Al compositions to reduce or prevent formation of the one or more defects in the device; and
    measuring the one or more defects to confirm the one or more amounts were obtained.

2. The method of claim 1, wherein the Al compositions x in the Al containing quantum well barriers are 0<x<5° A.

3. The method of claim 1, wherein the density of triangular dark defects, including triangular non-luminescent defects, is less than $4.5 \times 10^3$ cm$^{-2}$.

4. The method of claim 1, wherein the In containing quantum well layer and the Al containing barrier layers are such that the device emits or absorbs light having a peak wavelength greater than 515 nm.

5. The method of claim 1, wherein the device is a laser diode and having the Al composition wherein the laser diode has a threshold current density of no more than 30 kA/cm$^2$.

6. The method of claim 1, wherein the dark defects in the device structure have a surface area less than 100 micrometers by 100 micrometers.

7. A method for fabricating a semipolar plane III-nitride semiconductor-based optoelectronic device structure, comprising:
    forming one or more III-Nitride device layers including an active region, wherein:
        the active region comprises an Indium (In) containing quantum well layer positioned between first and second Aluminum (Al) quantum well barrier layers, the Al quantum well barrier layers having one or more Al compositions, and the forming includes:
selecting the Al compositions to obtain the device layers having a density of triangular dark defects less than $4.5 \times 10^3$ cm$^{-2}$, wherein the triangular dark defects include triangular non-luminescent defects;
depositing the first Aluminum (Al) containing quantum well barrier layer;
depositing the Indium (In) containing quantum well layer on the first Al containing quantum well barrier layer; and
depositing the second Al containing quantum well barrier layer on the In containing quantum well layer, wherein the In containing quantum well layer and the Al containing quantum well barrier layers are grown in a semipolar orientation on a semipolar plane; and measuring the density to confirm the density was obtained.

8. The method of claim 7, wherein the Al containing quantum well barrier layers are AlGaN and the In containing quantum well layer is InGaN.

9. The method of claim 7, further comprising:
positioning an upper In containing separate confinement heterostructure (SCH) layer and a lower In containing SCH layer on either side of the active region, wherein the upper and lower In containing SCH layers have an In composition greater than 10%.

10. The method of claim 9, wherein the upper and lower In containing SCH layers are InGaN layers.

11. The method of claim 9, wherein at least one of the upper In containing SCH layer and lower In containing SCH layer is an InGaN/GaN or InGaN/AlGaN super-lattice (SL) structure comprising varying In composition.

12. The method of claim 11, wherein the depositing and selecting is such that the device structure is a laser diode structure having an optical confinement factor of at least 3 and an output power of at least 2 mW for a drive current of 20 mA or current density of 833.3 Amps per centimeter square.

13. The method of claim 9, wherein the Al compositions reduce or prevent misfit dislocations in the III-Nitride device layers caused by the In composition of the lower and upper SCH layers, by compensating strain in the device structure caused by the lower and upper In containing SCH layers, as compared to quantum well barriers having lower Al compositions.

14. The method of claim 7, further comprising growing the III-Nitride device layers coherently without stacking faults or misfit dislocations.

15. The method of claim 7, wherein the III-Nitride device layers form a light emitting device, the active layer emits light, and the device emits the light uniformly across one or more of an entirety of a top surface, an entirety of a bottom surface, or an entirety of a sidewall of the active layer.

16. The method of claim 7, wherein the Al compositions reduce or prevent triangular dark defects in the device structure caused by an In composition in the semipolar In containing quantum well, by compensating strain due to the In composition in the quantum wells, as compared to quantum well barriers having lower Al compositions.

17. The method of claim 7, wherein the dark defects in the device structure have a surface area less than 100 micrometers by 100 micrometers.

18. The method of claim 7, wherein the semipolar plane is a (20-21), (11-22), (30-31), (30-3-1), (10-1-1), (n0-n1), or (n0-n-1) plane, and n is an integer, such that planar step growth is achieved, and the III-Nitride device layers and the active region have smooth planar surfaces and interfaces.

19. The method of claim 7, further comprising forming a laser cavity bounded by two mirrors, wherein the mirrors are etched by dry etching or cleaved.

20. The method of claim 7, wherein the Al compositions x in the first and second Al containing quantum well barriers are 0<x<5%.

21. The method of claim 7, wherein the device structure forms a (20-21) plane laser diode emitting green light.

22. The method of claim 7, wherein the device structure comprises an AlGaN cladding-free laser diode, the method further comprising:
depositing a first GaN cladding layer deposited on or above the semipolar plane of a GaN substrate;
depositing a first InGaN guiding or separate confinement heterostructure (SCH) layer deposited on or above the first GaN cladding layer;
depositing the active layer on or above the first InGaN guiding or SCH layer;
depositing a second InGaN guiding or SCH layer on or above the active layer; and
depositing a second GaN cladding layer deposited on or above the second InGaN guiding or SCH layer.

23. The method of claim 7, wherein the In containing quantum well layer and the first and second Al containing barrier layers are deposited such that the device emits or absorbs light having a peak intensity in a green, yellow, or red spectral range.

24. The method of claim 7, wherein the In containing quantum well layer and the Al containing barrier layers are such that the device emits or absorbs light having a peak wavelength greater than 515 nm.

25. The method of claim 7, wherein the In containing quantum well layer has an Indium composition of at least 16% and a thickness greater than 4 nanometers.

26. The method of claim 7, wherein the III-Nitride device layers have a top surface or interface with a root mean square surface roughness of less than 0.07 nm.

27. The method of claim 7, wherein the device structure is a laser diode structure and having the Al composition wherein the laser diode structure has a threshold current density of no more than 30 kA/cm$^2$.

28. The method of claim 7, having the Al composition wherein an output power of the device structure is at least 2 mW at a current density of no more than 833.3 Amps per centimeter square.

* * * * *